United States Patent
Gering

(10) Patent No.: US 11,815,557 B2
(45) Date of Patent: Nov. 14, 2023

(54) SYSTEMS AND METHODS FOR MANAGING ENERGY STORAGE OPERATIONS

(71) Applicant: BATTELLE ENERGY ALLIANCE, LLC, Idaho Falls, ID (US)

(72) Inventor: Kevin L. Gering, Idaho Falls, ID (US)

(73) Assignee: BATTELLE ENERGY ALLIANCE, LLC, Idaho Falls, ID (US)

( * ) Notice: Subject to any disclaimer, the term of this patent is extended or adjusted under 35 U.S.C. 154(b) by 204 days.

(21) Appl. No.: 17/015,369

(22) Filed: Sep. 9, 2020

(65) Prior Publication Data

US 2021/0072323 A1 Mar. 11, 2021

Related U.S. Application Data

(60) Provisional application No. 62/897,877, filed on Sep. 9, 2019.

(51) Int. Cl.
*G01R 31/392* (2019.01)
*H02J 7/00* (2006.01)
*G01R 31/374* (2019.01)
*H01M 10/44* (2006.01)
*G06F 17/18* (2006.01)

(52) U.S. Cl.
CPC ......... *G01R 31/392* (2019.01); *G01R 31/374* (2019.01); *H01M 10/443* (2013.01); *H02J 7/0071* (2020.01); *G06F 17/18* (2013.01)

(58) Field of Classification Search
CPC . G01R 31/392; G01R 31/374; H01M 10/443; H01M 10/44; H02J 7/0071; H02J 7/00712; G06F 17/18; Y02E 60/10
See application file for complete search history.

(56) References Cited

U.S. PATENT DOCUMENTS

| | | | | |
|---|---|---|---|---|
| 11,171,498 | B2 * | 11/2021 | Chemali | H02J 7/007192 |
| 11,500,024 | B2 * | 11/2022 | Gray | G01R 31/367 |
| 2007/0139008 | A1 | 6/2007 | Sterz et al. | |
| 2010/0123436 | A1 | 5/2010 | Herrod et al. | |
| 2011/0018679 | A1 | 1/2011 | Davis et al. | |
| 2012/0262107 | A1 * | 10/2012 | Zhao | H01M 10/441 320/107 |
| 2013/0009605 | A1 * | 1/2013 | Hongo | H01M 10/441 320/134 |
| 2013/0090900 | A1 * | 4/2013 | Gering | G01R 31/392 703/2 |

(Continued)

FOREIGN PATENT DOCUMENTS

EP 3605124 A1 * 2/2020 ............. G01R 31/36

*Primary Examiner* — Stacy Whitmore

(57) ABSTRACT

An energy storage device (ESD) manager determines charge conditions that result in charge-related aging of an energy storage device (ESD), such as a battery, cell, or the like. The ESD manager may determine charge-related costs for charge operations, which may quantify charge-related aging imposed by subjecting ESD to specified charge conditions. The ESD manager may evaluate and/or modify charge operations to reduce charge-related aging. The ESD manager may be further configured to model charge-related aging behavior over time and/or under variable charge conditions. The ESD manager may configure charge operations to ensure that charge-related performance loss remains below a threshold for a specified usage duration.

23 Claims, 10 Drawing Sheets

(56) References Cited

U.S. PATENT DOCUMENTS

| | | | |
|---|---|---|---|
| 2013/0175997 A1* | 7/2013 | Hongo | H02J 7/0048 |
| | | | 320/134 |
| 2014/0002031 A1 | 1/2014 | Chaturvedi et al. | |
| 2015/0066406 A1 | 3/2015 | Sun et al. | |
| 2015/0326037 A1 | 11/2015 | Borhan et al. | |
| 2017/0267116 A1* | 9/2017 | Lindemann | B60L 53/66 |
| 2018/0143257 A1* | 5/2018 | Garcia | G01R 31/382 |
| 2019/0212391 A1* | 7/2019 | Koller | B60L 58/16 |
| 2020/0006944 A1* | 1/2020 | Fife | H02J 3/466 |
| 2022/0085627 A1* | 3/2022 | Nishida | H02J 7/00041 |
| 2022/0352596 A1* | 11/2022 | Chai | H01M 50/30 |
| 2022/0365140 A1* | 11/2022 | Gray | G01R 31/382 |

\* cited by examiner

SYSTEMS AND METHODS FOR MANAGING ENERGY STORAGE OPERATIONS

CROSS REFERENCE TO RELATED APPLICATIONS

This application claims the benefit of U.S. Provisional Application No. 62/897,877 filed Sep. 9, 2019, which is incorporated by reference herein.

STATEMENT REGARDING FEDERALLY SPONSORED RESEARCH OR DEVELOPMENT

This invention was made with government support under Contract Number DE-AC07-05-ID12517 awarded by the United States Department of Energy. The government has certain rights in the invention.

TECHNICAL FIELD

This disclosure relates to energy storage management and, in particular, to systems and methods for managing energy storage devices.

SUMMARY

Disclosed herein are systems, methods, and apparatus for determining conditions that affect charge-related aging mechanisms (charge conditions), and for modeling charge-related aging characteristics associated with specified charge conditions. Disclosed herein are examples of methods for managing one or more energy storage devices (ESD), including methods for managing energy storage operations, such as charge operations on the ESD. Examples of the disclosed methods may include developing aging models for respective ESD (and/or respective ESD types), the aging models configured to model temporal, charge-related aging of the ESD. Aspects of the disclosed methods may further include selecting conditions for charge operations to be performed on the ESD in accordance with the aging models and/or implementing charge operations on the ESD in accordance with the selected charge conditions. Some examples of the disclosed method comprise evaluating charge-related aging associated with a determined charge configuration and modifying the charge configuration in response to the evaluating. The evaluating may comprise determining an extent and/or rate of charge-related performance degradation for the charge configuration. The method may further comprise modifying the charge configuration in order to reduce the extent and/or rate of charge-related performance degradation. In some aspects, the disclosed method comprises determining, developing, and/or refining aging models based on ESD aging data acquired under designated conditions, the ESD aging data comprising non-charge-related aging data configured to quantify performance degradation associated with non-charge-related aging mechanisms, such as discharge-related aging mechanisms. The non-charge-related aging data may comprise performance measurements acquired over intervals in which ESD are charged under baseline charge conditions configured to minimize and/or exclude charge-related ESD aging. The ESD aging data may further comprise charge-related aging data configured to quantify performance degradation under specified charge conditions, different from the baseline charge conditions. Examples of the disclosed method may comprise developing an aging model through regression analysis of the non-charge related aging data and the charge-related aging data.

In some implementations, charge-related performance degradation is modeled during each of a plurality of usage periods, each usage period associated with respective charge conditions. Charge conditions for one or more of the usage periods may be determined and/or modified based, at least in part, on the aging model.

Further disclosed herein are examples of an apparatus or device for modeling charge-related aging. The device may comprise an ESD manager configured for operation on a computing device. The ESD manager may be configured to determine a maximum extent of charge-related aging imposed by specified charge conditions. The ESD manager may be configured to determine cost metrics configured to quantify charge-related aging imposed by proposed charge operations. The ESD manager may be further configured to modify charge operations in order to, inter alia, reduce charge-related aging. The ESD manager may be further configured to aging models, which may be configured to predict the extent and/or rate of charge-related performance degradation of ESD over time. The ESD manager may be configured to configure charge operations in accordance with the aging models. In some examples, the ESD manager is further configured to model charge-related aging during a plurality of usage periods, each usage period associated with respective charge conditions. The ESD manager may be configured to determine and/or modify charge conditions during one or more of the usage periods. The modifications may be configured to satisfy a usage guarantee.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements and have been solely selected for ease of recognition in the drawings.

DETAILED DESCRIPTION

Figure 1A:
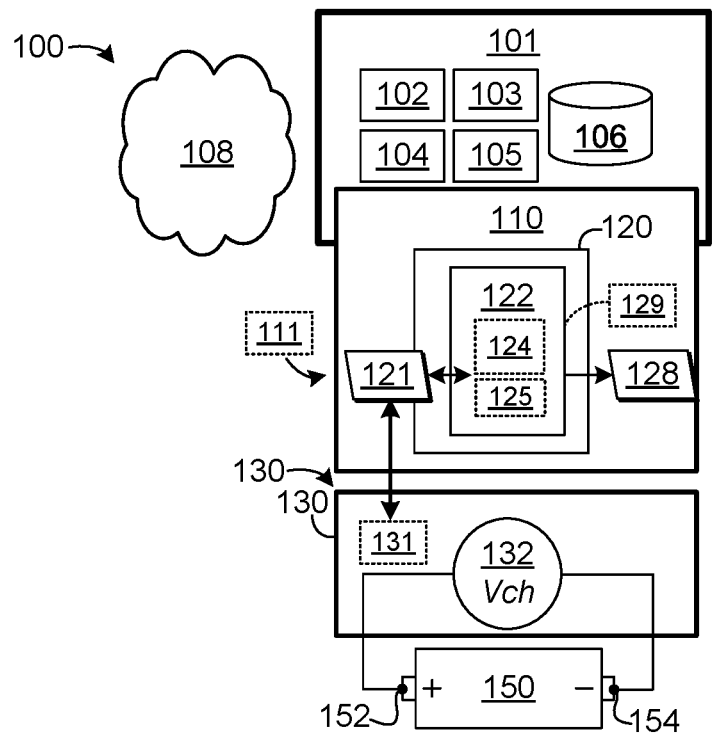
FIG. 1A illustrates an example of a system for managing energy storage devices.

As used herein, unless context requires otherwise, an ESD refers to a physical structure, component, apparatus, and/or device capable of storing energy and discharging the stored energy as electrical energy. An ESD may be capable of maintaining a potential differential between two or more terminals (e.g., a voltage differential ΔV). An ESD may include one or more of a cell, an electrochemical cell, a collection of one or more cells, a collection of one or more electrochemical cells, a battery comprising one or more cells, an electrochemical battery comprising one or more electrochemical cells, an aluminum-ion battery, a carbon battery, a flow battery, a vanadium redox battery, a zinc-bromide battery, a zinc-cerium battery, a lead-acid battery, a glass battery, a lithium-ion battery, a lithium cobalt oxide battery, a lithium ion manganese oxide battery, a lithium ion polymer battery, a lithium iron phosphate battery, a lithium-sulfur battery, a thin film lithium-ion battery, a lithium ceramic battery, a magnesium-ion battery, a metal-air electrochemical battery, a lithium-air battery, an aluminum-air battery, a germanium-air battery, a calcium-air battery, an iron air battery, a potassium-ion battery, a silicon-air battery, a zinc-air battery, a tin-air battery, a sodium-air battery, a beryllium-air battery, a molten salt battery, a nickel-cadmium battery, a nickel-hydrogen battery, a nickel-iron battery, a nickel metal hydride battery, a nickel-zinc battery, a polymer-based battery, a rechargeable alkaline battery, a silver-zinc battery, a silver-cadmium battery, a sodium-sulfur battery, a super iron battery, a zinc-ion battery, and/or the like.

As used herein, the "capacity" or "maximum capacity" of an ESD (capacity C) refers to an amount of energy capable of being stored by the ESD and/or discharged therefrom. The capacity of an ESD may be expressed in terms of electrical energy, such as watt-hours (Wh), kilowatt-hours (kWh), ampere-hours (Ahr), or the like. The State of Charge (SoC) of an ESD may refer to the level of charge stored within the ESD relative to the capacity of the ESD (e.g., as a percentage of the maximum capacity C). The SoC of an ESD may indicate an amount of electrical energy capable of being discharged from the ESD at a given magnitude of discharge current. The rate at which electrical energy may be discharged from an ESD may be referred to the discharge rate of the ESD. The discharge rate may be expressed in terms of ESD capacity. The discharge rate of an ESD may be expressed in terms of a C-rate (Amps/hr), relative to a specified $C_1$ discharge rate of the ESD. The $C_1$ discharge rate may indicate a current output of the ESD to discharge the ESD from a full SoC over an hour (e.g., may correspond to the ESD capacity expressed as Ahr).

As used herein, unless context requires otherwise, charging an ESD refers to storing energy within the ESD (e.g., replenishing or filling the capacity of the ESD). Charging may comprise supplying electrical power to the ESD (e.g., driving an electrical current into the ESD at a particular range of voltage potential). As disclosed herein, an ESD may comprise one or more electrochemical cells, each capable of storing energy in the form of chemical potential energy. The electrochemical cells of the ESD may be capable of discharging stored chemical potential energy as electrical power. Charging an ESD may comprise supplying electrical power to the ESD and configuring the ESD to store the supplied electrical power as chemical potential energy (e.g., within one or more electrochemical cells). The time required to charge an ESD may, therefore, be a function of the rate at which electrical power is supplied to the ESD (and/or the rate at which the ESD is capable of accepting and storing the supplied electrical power as chemical potential energy). The charge rate of an ESD that is charged may be expressed in terms of the manufacturer's rated capacity (C-rate) of the ESD and may differ from the discharge rate. The charge rate of an ESD may be expressed in terms of a C-rate (Amps/hr) related to a specified discharge rate.

The manner in which an ESD is charged can significantly impact the usable life of the ESD. Charge operations may contribute to ESD aging. As used herein, "ESD aging" refers to a process by which performance of an ESD deteriorates over time and/or in response to the conditions to which the ESD is subjected. ESD aging may result in degraded ESD performance, such as reductions to one or more ESD performance characteristics, which may include, but are not limited to: decreased capacity, faster temperature rise during operation, less charge acceptance, higher internal impedance, lower voltage, more frequent self-discharge, and so on. Although charging batteries at high charge rates can advantageously reduce ESD charge time, the use of high charge rates can cause damage leading to more rapid ESD aging (shortened ESD life) or even unsafe conditions. Charging ESDs at high charge rates can significantly exacerbate ESD aging, particularly where the ESDs are maintained under high SoC conditions. The use of high charge rates may, therefore, shorten ESD life and reduce safety. What is needed are systems, methods, and devices for optimizing charge operations to prolong ESD life and safety while ensuring satisfactory ESD performance over the intended life of the application. More specifically, what is needed are systems, methods, and devices for modeling ESD aging behavior under different charge conditions, and using the modeled ESD aging behaviors to, inter alia, manage charge operations.

The performance of an ESD may degrade as the ESD ages (e.g., as the ESD endures charge/discharge cycles under various conditions). Age-related performance loss may result in degradation of one or more ESD performance characteristics. As disclosed above, the conditions under which an ESD is charged may significantly impact the rate at which the ESD ages. Charging at high charge rates may result in shortened ESD life or even unsafe conditions (e.g., catastrophic ESD failure, such as short-circuits, or the like).

These adverse effects can be exacerbated when high charge rates are applied under high SoC conditions. ESD aging can also be affected by the conditions under which charging occurs (e.g., temperature). By way of non-limiting example, charging lithium-ion batteries at low temperatures can result in lithium dendrite growth, which can lead to reduced energy capacity or even ESD failure. Although performing charge operations at high charge rates may advantageously reduce the time required for charge operations, the use of high charge rates can significantly increase the rate at which certain batteries age, or even lead to failure under certain conditions.

FIG. 1A illustrates an example of a system 100 for managing ESD and/or charge operations on such devices. The system 100 may comprise an ESD manager 110 (e.g., battery manager or simply manager), which may be configured to, inter alia, profile, model, diagnose, and/or predict charge-related aging behaviors resulting from charge operations on respective ESD 150. The ESD manager 110 may be configured to predict changes in ESD performance characteristics due to specified charge operations, such as decreased capacity, faster temperature rise during operation, less charge acceptance, higher internal impedance, lower voltage, more frequent self-discharge, and so on. As disclosed in further detail herein, the ESD manager 110 may be configured to model ESD aging under specified conditions (develop aging models for respective ESD 150 and/or ESD types) and may leverage the aging models to manage energy storage operations performed on the ESD based, at least in part, on age-related charge costs associated with the operations. As disclosed in further detail herein, the ESD manager 110 may be configured to develop aging models 125 configured to predict aging behavior of respective ESD 150 (and/or ESD types) based, at least in part, on characteristics of the ESD 150 (and/or ESD types), charge conditions, and so on.

The ESD manager 110 may comprise and/or be embodied on one or more computing systems, such as a computing device 101. The ESD manager 110 may comprise and/or be configured for operation on computing resources, such as a processor 102, memory 103, communication interface 104, human-machine interface (HMI) components 105, non-transitory storage 106, and/or the like. The processor 102 may comprise any suitable means for processing and/or executing computer-readable instructions (e.g., code, machine code, assembly code, source code, interpretable code, script, and/or the like), including, but not limited to: a circuit, a chip, a package, a microprocessor, a microcontroller, a central processing unit, a general-purpose processing unit, a special-purpose processing unit, processing circuitry, logic circuitry, an integrated circuit (IC), a System on a Chip, a Programmable System on a Chip (PSoC), a System in Package (SiP), an Application-Specific Integrated Circuit (ASIC), configurable circuitry, programmable circuitry, a Field Programmable Gate Array (FPGA), a Complex Programmable Logic Device (CPLD), a Programmable Logic Array (PLA), and/or the like. The memory 103 may comprise any suitable means for storing and/or retrieving electronic data including, but not limited to: cache memory, volatile memory, non-volatile memory, Random-Access Memory (RAM), Dynamic RAM (DRAM), Static RAM (SRAM), Thyristor RAM (TRAM), Zero-Capacitor RAM (ZRAM), and/or the like. In some examples, the computing device 101 comprises a communication interface 104, which may comprise any suitable means for communicatively and/or operatively coupling the computing device 101 to one or more electronic communication networks (e.g., network 108), and may comprise, but is not limited to: a network interface, a network link, a network card, a network driver, a network protocol, a network stack, and/or the like. The network 108 may comprise any suitable means for electronic communication, including one or more of: a wired communication network, a wireless communication network, the Internet, a virtual private network (VPN), a wide area network (WAN), a WiFi network, a public switched telephone network (PSTN), a cellular communication network, a cellular data network, an Internet Protocol (IP) network, a satellite network, a Near Field Communication (NFC) network, a Bluetooth network, a mesh network, a grid network, and/or the like. The HMI components 105 may comprise any suitable means for interacting with the computing device 101, including, but not limited to: input/output devices, output devices, display devices, visual display devices (e.g., a monitor), touch display devices, audio output devices (e.g., speakers), haptic feedback devices, input devices, data input devices (e.g., a keyboard), gesture input devices (e.g., a mouse or touch pad), data capture devices, image capture devices (e.g., a camera or scanner), audio capture devices, and/or the like. The non-transitory storage 106 may comprise any means for persistently storing and/or retrieving electronic data and may include, but is not limited to: a non-transitory storage device, a non-transitory memory device, a solid-state memory, a hard drive, a magnetic disk storage device, an optical storage device, a tape storage device, a Flash memory, a NAND-type Flash memory, a NOR-type Flash memory, a Programmable Metallization Cell (PMC) memory, a Silicon-Oxide-Nitride-Oxide-Silicon (SONOS) memory, a Resistive RAM (RRAM) memory, a Floating Junction Gate RAM (FJG RAM), a ferroelectric memory (FeRAM), a magnetoresistive memory (MRAM), a phase change memory (PRAM), an Electrically Erasable Programmable Read-Only Memory (EEPROM), a cache storage device, a remote storage device, a network-attached storage (NAS) device, and/or the like.

In some examples, the ESD manager 110 (and/or portions thereof) may be embodied as hardware components, such as components of a computing device and/or computing resources. Alternatively, or in addition, the ESD manager 110 (and/or portions thereof) may be embodied as computer-readable instructions stored within non-transitory storage of a computing device (e.g., non-transitory storage 106). The computer-readable instructions may be configured for execution by the processor 102, which execution may configure a computing device to implement operations for energy storage management, as disclosed herein.

In some implementations, the ESD manager 110 may include and/or be coupled to an ESD interface device, such as an ESD analysis device, an ESD test equipment (e.g., a battery tester), an ESD conditioning device (e.g., battery conditioning equipment), an ESD diagnostic device, a charger, a battery charger, a cell charger, and/or the like. In the FIG. 1A example, the ESD manager 110 may include and/or be coupled to an ESD charging device (a charging device 130). The charging device 130 may be configured to implement charge operations on ESD 150. In some implementations, the ESD manager 110 may be configured to determine, adapt, modify, and/or otherwise control charge operations implemented by the charging device 130. The ESD manager 110 may generate and/or modify charge instructions 131 corresponding to a charge configuration 121 determined for an ESD 150, the charge instructions 131 configured to cause the charging device 130 to implement charge operations on the ESD 150 in accordance with the charge configuration 121 (e.g., implement a charge operation per the charge-operation characteristics of the charge configuration 121). As disclosed in further detail herein, the charge configurations 121 determined for an ESD 150 may be based, at least in part, on projected charge-related aging of the ESD 150 resulting from the charge operations.

The ESD manager 110 may comprise an age modeling engine 120, which may be configured to predict and/or model ESD aging under various conditions (e.g., predict, model, and/or project charge-related aging of ESD 150 charged under various charge conditions 124). The age modeling engine 120 may be configured to quantify ESD aging in terms of performance loss and/or percentage of performance loss. As used herein, "performance loss" in incurred by an ESD 150 may refer to degradation of one or more performance characteristics of the ESD 150 (one or more ESD performance characteristics). The ESD performance characteristics may pertain to any suitable characteristic and/or capability of an ESD 150, including, but not limited to: energy storage capacity, charge acceptance, charge retention, power delivery, discharge rate, internal impedance, ESD voltage, cell voltage, frequency of self-discharge, temperature rise during operation, temperature rise during charge operations, temperature rise during discharge operations, and/or the like. The age modeling engine 120 may comprise and/or be coupled to a charge-related aging (CRA) modeler 122, which may be configured to model charge-related ESD aging mechanism(s) of respective ESD 150 (and/or ESD types) as a function of, inter alia, charge conditions 124.

The CRA modeler 122 may determine aging models 125 for respective ESD 150 and/or ESD types. As used herein, an "ESD type" refers to a particular type of ESD 150. An ESD type may refer to a particular model or version of ESD 150, ESD 150 having a particular cell chemistry and/or composition, ESD 150 comprised of particular materials, and/or the like. An aging model 125 determined for a particular ESD type may, therefore, be configured to model aging behavior of ESD 150 of the particular type. The aging model 125 of an ESD 150 may predict aging behavior of the ESD 150 based, at least in part, on the conditions under which the ESD 150 is charged (based on charge conditions 124). The aging model 125 may be based on and/or incorporate charge conditions 124 determined to correlate with charge-related aging (based on analysis, testing, and/or experience). The charge conditions 124 may include, but are not limited to: characteristics of the type of ESD to be charged in the charge operation (ESD-type characteristics), characteristics of the particular ESD 150 being charged in the charge operation (ESD-specific characteristics), characteristics of the charge operation itself (charge-operation characteristics), and so on.

The charge-related aging characteristics of a charge operation may be represented by a charge configuration 121 of the charge operation. As used herein, a "charge configuration" 121 refers to electronic information pertaining to a charge operation to be performed on a particular ESD 150 (or an ESD 150 of a particular ESD type). The charge configuration 121 for a charge operation to be performed on a designated ESD 150 may include ESD-type characteristics corresponding to the ESD type of the designated ESD 150, ESD-specific characteristics of the designated ESD 150, charge-operation characteristics of the charge operation to be performed on the designated ESD 150 (e.g., by the charging device 130 or other charging mechanism), and/or the like.

The ESD-type characteristics of a charge configuration 121 (and charge conditions 124 of the corresponding charge operation) may comprise information pertaining to the type of ESD 150 to be charged in the charge operation (the ESD type), which may include, but are not limited to: ESD chemistry, cell chemistry, material(s) comprising the ESD, anode material, anode type, cathode material, cathode type, ESD capacity, maximum voltage, maximum cell voltage, minimum voltage, minimum cell voltage, cell count, cell configuration, discharge rate ($C_1$), discharge current, maximum discharge rage, maximum charge rate, a charge-related aging factor ($M_{ch}^o$), and/or the like. As disclosed in further detail herein, the charge-related aging factor ($M_{ch}^o$) may quantify a maximum fraction or percentage of performance degradation attributable to charging conditions (e.g., $M_{ch}^o = 1 - M_{NCA}^o$, where $M_{NCA}^o$ represents a fraction of performance degradation due to non-charge-related conditions, such as discharge conditions).

The ESD-specific characteristics of a charge configuration 121 for an ESD 150 (and charge conditions 124 of the corresponding charge operation) may comprise information pertaining to the ESD 150, which may include, but are not limited to: an initial SoC of the ESD 150, an initial voltage of the ESD 150, an age of the ESD 150 (e.g., effects of the charge-relating aging due to respective charge conditions 124 may vary based on, inter alia, the age of the ESD 150 being charged), a polarization offset of the ESD 150, and/or the like.

The charge-operation characteristics of a charge configuration 121 for a ESD 150 (and/or charge conditions 124 of the corresponding charge operation) may comprise information pertaining to the charge operation to be performed on the ESD 150 by the charging device 130 (or other charging mechanism), which may include, but are not limited to: a start voltage for the charge operation, a start voltage (e.g., an initial voltage of the ESD 150), a start SoC (e.g., an initial SoC of the ESD 150), a target voltage or SoC for the charge operation, which may correspond to the maximum voltage or SoC of the ESD 150 (per the ESD-type characteristics thereof), a voltage range for the charge operation (e.g., start voltage versus target voltage), an SoC range for the charge operation (e.g., initial SoC versus target SoC), a temperature during the charge operation (e.g., a temperature of the ESD 150, ambient temperature, or the like), and so on.

The ESD manager 110 may be configured to obtain portions of the charge configuration 121 (and/or charge conditions 124) for a charge operation to be performed on an ESD 150 from one or more of: an ESD interface device coupled to the ESD 150, the charging device 130, a datastore (e.g., profile data associated with the ESD 150), and/or the like. For example, the ESD manager 110 may determine ESD-type characteristics of the ESD 150 based, at least in part, on information determined by and/or input to the charging device 130 (e.g., ESD type, ESD chemistry, ESD capacity, and/or the like). The ESD manager 110 may retrieve the information from the charging device 130 and incorporate the retrieved information into the charge configuration 121. The ESD manager 110 may be further configured to retrieve ESD-specific and/or charge-operation characteristics from the ESD 150 and/or charging device 130, such as the initial voltage or SoC of the ESD 150, a voltage differential measured across terminals 152 and 154, an impedance of the ESD 150, and so on. Alternatively, or in addition, the ESD manager 110 may be configured to retrieve information pertaining to the ESD 150 from a datastore (e.g., from the non-transitory storage 106 of the computing device 101, or other storage resource). The ESD manager 110 may be configured to determine an identifier of the ESD 150 and may use the identifier to retrieve information pertaining to the ESD 150 from the datastore (e.g., retrieve ESD-type characteristics, ESD-specific characteristics, and so on). In some implementations, the ESD manager 110 is configured to maintain and/or retrieve age modeling data pertaining to respective ESD 150 (and/or ESD types) from ESD profile(s) associated with the respective ESD 150 (and/or ESD types). The ESD profile associated with an ESD 150 may include ESD-type characteristics of the ESD 150, ESD-specific characteristics of the ESD 150, an aging model 125 of the ESD 150, and/or the like.

The age modeling engine 120 may be configured to determine cost metrics for specified charge configurations 121 (charge cost (CC) metrics 128). The CC metrics 128 determined for a charge configuration 121 may be configured to quantify an amount of charge-related ESD aging imposed on the ESD 150 in response to being charged under the charge conditions 124 specified by the charge configuration 121. The CC metrics 128 may be determined by applying the charge configuration 121 (and/or charge conditions 124) to the aging model 125 associated with the ESD 150 (and/or ESD type). The CC metrics 128 produced by the aging model 125 may represent charge-related aging of the ESD 150 in terms of degradation to one or more ESD performance characteristics (e.g., performance loss and/or percentage of performance loss). In some implementations, the aging model 125 (and/or CC metrics 128 produced by the aging model 125) may predict the maximum extent of performance degradation imposed by respective charge conditions 124 and/or the rate at which the degradation will occur (e.g., as a function of time).

In some implementations, the ESD manager 110 may receive information pertaining to charge operations (charge input data 111). The charge input data 111 may include information pertaining to a proposed charge operation to be performed on an ESD 150. The ESD manager 110 may receive charge input data 111 from the charging device 130. Alternatively, or in addition, the ESD manager 110 may receive charge input data through another mechanism, such as an interface, a communication interface 104 of the computing device 101, an application programming interface (API), user interaction with one or more HMI components 105, and/or the like. The charge input data 111 may include portions of a charge configuration 121 for the charge operation. For example, the charge input data 111 may include charge-operation characteristics, such as a proposed charge rate, target voltage, target SoC, and/or the like. The charge input data 111 may also include ESD-type characteristics and/or ESD-specific characteristics, such as an identifier of the ESD 150, initial voltage, initial SoC, age of the ESD 150, an identifier of the ESD 150, an indication of the type of the ESD 150 (an ESD type identifier), and/or the like. The ESD manager 110 may use charge input data 111 associated with charge operations to, inter alia, develop charge configurations 121 for the charge operations.

As disclosed herein, the charge configuration 121 of a charge operation may comprise, define, and/or correspond to one or more charge conditions 124. A charge configuration 121 may comprise: ESD-type characteristics; ESD-specific characteristics; charge-operation characteristics; and/or the like. ESD-type characteristics may comprise information pertaining to the type of ESD to be charged (e.g., may specify the chemistry of the ESD, maximum ESD voltage, minimum ESD voltage, discharge rate, maximum charge rate, ESD materials, anode type, cathode type, and so on). The ESD-type characteristics may be included in a charge configuration 121 (or charge input data 111). Alternatively, or in addition, the charge configuration 121 may reference predetermined ESD-type characteristics maintained by the ESD manager 110 (e.g., within the non-transitory storage 106 or other datastore). A charge configuration 121 may further comprise ESD-specific characteristics pertaining to the specific ESD 150 to be charged, such as the current SoC of the ESD 150, initial voltage of the ESD 150, initial SoC of the ESD 150, ESD polarization offset, and/or the like, as disclosed herein. The charge configuration 121 may further comprise charge-operation characteristics (e.g., charge rate, start voltage for the charge operation, target voltage for the charge operation, temperature during charging, and so on). The charge configuration 121 of proposed charge operation may, therefore, define charge conditions 124 to be imposed on the ESD 150 in the proposed charge operation (e.g., imposed on an ESD 150 of a specified type and/or and ESD 150 having particular ESD-specific characteristics).

The CRA modeler 122 may include, determine, and/or maintain aging model(s) 125 for ESD 150, which may be configured to model charge-related aging imposed on the ESD 150 based on the charge conditions 124 to which the ESD 150 are subjected. The aging model 125 may comprise a generalized formalism capable for modeling charge-related aging behavior (developing aging models) covering a large range of charge conditions 124 (e.g., different ESD-type characteristics, ESD-specific characteristics, charge-operation characteristics, and so on). The aging model 125 may be configured to predict degradation of one or more ESD performance characteristics due to charge conditions 124, such as decreased capacity, lower charge acceptance, higher internal resistance, lower voltage, and/or the like.

The age modeling engine 120 may utilize the aging model 125 to determine CC metrics 128 for charge configurations 121 (for charge configurations 121 characterizing charge operations on specified ESD 150 and/or specified ESD types). The CC metrics 128 determined for a charge configuration 121 may quantify aging costs incurred by subjecting an ESD 150 (or ESD 150 of a particular ESD type) to the charge conditions 124 of the charge configuration 121. In the FIG. 1A example, the CC metrics 128 may quantify charge-related ESD aging in terms of capacity loss attributable to specified charge conditions 124. The disclosure is not limited in this regard, however. The CRA modeler 122 (and/or aging model 125) may be adapted to produce CC metrics 128 configured to model degradation of any suitable ESD performance characteristic(s), including, but not limited to: capacity, discharge rate, $C_1$ discharge rate (or other reference), impedance, potential differential (voltage differential between the terminals thereof), decreased charge acceptance, frequency of self-discharge, and/or the like.

In the FIG. 1A example, the aging model 125 may produce an $M_{ch}$ quantity for respective charge configurations 121. The $M_{ch}$ quantity may be configured to quantify the maximum extent of performance loss incurred by an ESD 150 (and/or ESD type) under charge conditions 124 of the charge configurations 121. The $M_{ch}$ quantity produced by the aging model 125 may define an upper bound of charge-related aging attributable to the charge conditions 124 over the usable life of the ESD 150, as follows:

$$M_{ch} = M_{ch}^o f_{SOC}\left[1 - \exp\left(-\alpha\left(\frac{2r_{ch}}{r_{ch\_max}}\right)^{\frac{1}{b}}\right)\right] \quad \text{Eq. 1}$$

$$f_{SoC} = \frac{b}{2}\left(1 + (c*d)^{\frac{1}{2}}\right) \quad \text{Eq. 2}$$

-continued $$b = \frac{(V_{max} - V_{min})}{\frac{1}{2}(V_{max} + V_{min})} \left(\frac{V_{ch} - V_{min}}{V_{max} - V_{ch} + \Delta V_{pol}}\right)^{\frac{1}{V_{ch}}} \quad \text{Eq. 3}$$

$$c = \frac{(V_{ch} - V_{start})}{(V_{ch} - V_{min})} \quad \text{Eq. 4}$$

$$d = \frac{V_{ch}}{V_{max}} \quad \text{Eq. 5}$$

$$\alpha = f_T\left(\frac{T_{ref}}{T_{actual}}\right) \quad \text{Eq. 6}$$

As illustrated above, the $M_{ch}$ quantity of the aging model 125 may be based on: a charge-related aging factor $M_{ch}^{\circ}$ configured to quantify the maximum net theoretical extent of ESD aging that can be attributed to charging conditions; a charge rate parameter rah for the specified charge operation (e.g., expressed in terms of a C-rate relative to the $C_1$ discharge rate of the specified ESD 150 to be charged in the charge operation); a maximum charge rate of the specified ESD 150 $r_{ch\_max}$ (typically detailed in manufacturer's guidelines); a maximum voltage for the specified ESD 150 $V_{max}$ (e.g., a maximum workable voltage for the specified ESD 150 per the cell chemistry thereof); a minimum voltage for the specified ESD 150 $V_{min}$ (e.g., a minimum workable voltage for the specified ESD 150 per the cell chemistry thereof); a start voltage $V_{start}$ for the specified charge operation (e.g., a voltage at which the ESD 150 is charged at a beginning of the charge operation, which may correspond to a current SoC and/or voltage of the specified ESD 150); a target voltage for the specified charge operation $V_{ch}$ (e.g., the voltage at the end of the charge operation, which may correspond to the $V_{max}$ of the specified ESD 150); a polarization offset of voltage for the particular ESD 150 $\Delta V pol$ (e.g., a small value on the order of 0.01V, which may be a function of aging of the particular ESD 150); and a material and temperature parameter $\alpha$. The $\alpha$ parameter may be a function of a temperature at which the specified charge operation is to be performed ($T_{actual}$) and a reference temperature of the specified ESD 150 to be charged ($T_{ref}$, which may correspond to materials used to construct components of the specified ESD 150, such as the anode, or the like).

In some examples, the CRA modeler 122 is configured to calculate the b, c, and d parameters of the aging model 125 (e.g., Eq. 1) in terms of ESD voltage (e.g., difference between the initial voltage of the ESD 150 $V_{start}$ and the target voltage of the charge operation $V_{ch}$, as shown in Eqs. 3-5). The disclosure is not limited in this regard; however, the CRA modeler 122 may be configured to use scaled SoC quantities in the derivation of b, c, and/or d in place of $V_{start}$ and/or $V_{ch}$ (e.g., scaled SoC quantities between 0 and 1). Conversions between voltage and equivalent SoC quantities (voltage to SoC conversions) may be unique to respective ESD types; e.g., voltage to SoC conversions may be defined and/or specified by, inter alia, ESD-type characteristics, as disclosed herein. In some examples, voltage to SoC conversions may be ESD type and/or ESD specific; e.g., may be defined and/or specified by, inter alia, ESD-specific characteristics, as disclosed herein. A voltage to SoC conversion may specify any suitable relationship between voltage and SoC (or vice versa), including, but not limited to: a proportional relationship, a linear relationship, an exponential relationship, a non-linear relationship, and/or the like. In some examples, the CRA modeler 122 is configured to determine whether to express b, c and/or d in terms of voltage or SoC based on characteristics of the ESD 150 being modeled (e.g., ESD-type and/or ESD-specific characteristics). By way of non-limiting example, lithium-ion ESD 150 having lithiated iron phosphate/graphite (LFP/Gr) chemistries may exhibit relatively flat voltage regions. In response to detecting the flat voltage regions, the CRA modeler 122 may model charge-related aging behavior of such ESD 150 using b, c, and/or d quantities expressed in terms of SoC, which may show more appreciable change and, as such, may convey more information.

As disclosed above, the $M_{ch}$ and $M_{ch}^{\circ}$ quantities of the aging model 125 may be expressed in terms of performance loss (e.g., degradation of a specified ESD performance characteristics, such as capacity, power delivery, and/or the like). The $M_{ch}^{\circ}$ term may represent a maximum extent of performance loss attributable to charging conditions 124. More specifically, $M_{ch}^{\circ}$ may represent a theoretical maximum space wherein additional performance loss (aging) can occur due to the collective charge conditions. The $M_{ch}^{\circ}$ term may be expressed as a fraction or percent of a full or total extent of performance loss over time ($M_{total}$); e.g., $M_{ch}^{\circ}=1-\{M_{NCA}^{\circ}\}$, or $M_{ch}^{\circ}=100\%-\{M_{NCA}^{\circ}\}$, where $M_{NCA}^{\circ}$ represents a fraction or percentage of total performance loss ($M_{total}$) attributable to non-charge-related mechanisms, such as discharge-related aging, and/or the like. The MA term of the aging model 125 may, therefore, be bounded by 1 or 100% (e.g., may comprise a fraction between 0 and 1 and/or a percentage between 0 and 100%).

Figure 2:
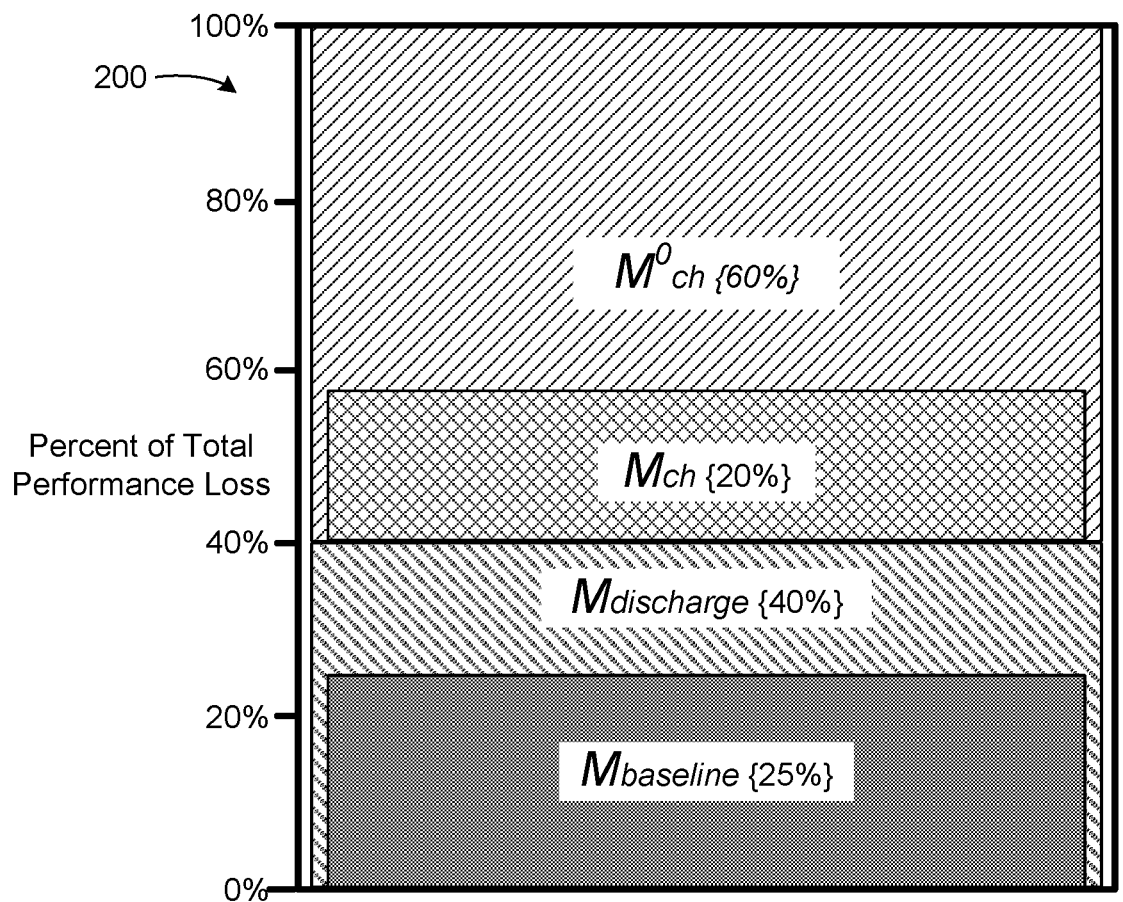
FIG. 2 illustrates an example of an aging model of age-related performance loss in incurred by an energy storage device.

By way of further illustration, exemplary, non-limiting examples of age-related quantities of the aging model 125 are depicted in plot 200 of FIG. 2. In the FIG. 2 example, the age-related quantities may be expressed in terms of performance loss percentages (e.g., may range from 0 to 100%, as disclosed above). By way of further non-limiting example, the age-related performance degradation may be expressed in terms of reduced storage capacity, wherein operating the ESD 150 under specified conditions results in the capacity of the ESD 150 degrading from an initial capacity of X Ahr to a reduced capacity of X–L Ahr over time. Accordingly, L Ahr may represent the full or total extent of performance loss ($M_{total}$), such that 0% performance loss corresponds to substantially no capacity loss (capacity of X Ahr) and 100% performance loss corresponds to a reduction by L Ahr (capacity of X–L Ahr). FIG. 2 illustrates a percentage of performance loss attributable to respective aging mechanisms, including charge-related aging modeled by the CRA modeler 122 (e.g., the aging model 125), as disclosed herein. In the FIG. 2 example, the maximum extent of charge-related aging ($M_{ch}^{\circ}$) is about 60%; the maximum percentage of $M_{total}$ (L Ahr capacity reduction) that can be attributed to charge conditions 124 is 60%. The maximum extent of charge-related aging attributable to specified charge conditions 124 ($M_{ch}$) may be a percent or fraction of $M_{ch}^{\circ}$ (about 20% of the full extent of performance loss in the FIG. 2 example). FIG. 2 further illustrates contributions of other aging mechanisms, such as discharge-related aging, as disclosed in further detail herein.

Referring back to FIG. 1A, in some examples, the ESD manager 110 may be further configured to adapt charge configurations 121 according to the aging model 125 (e.g., per CC metrics 128 determined for the charge configurations 121). The charge configurations 121 may be adapted to, inter alia, reduce or otherwise manage the extent and/or rate charge-related aging incurred by the ESD 150.

The ESD manager 110 may be further configured to implement charge operations. The ESD manager 110 may be operatively and/or communicatively coupled to charge module or charging device 130, which may be configured to implement charge operations on ESD 150. The charging device 130 may be electrically coupled to a first terminal 152 and a second terminal 154, which may comprise and/or correspond to a cathode and anode of the ESD 150, respectively. Implementing a charge operation may comprise the charging device 130 supplying electrical power to the ESD 150 by use of a power supply 132. The power supply 132 may be configured to drive current into and/or through terminals 152 and 154 (e.g., by generating a voltage differential Vch between the terminals 152 and 154, which may be coupled to an anode and cathode of the ESD 150, respectively).

In some implementations, the ESD manager 110 may be configured to determine CC metrics 128 for charge operations to be performed by the charging device 130 (per the aging model 125, as disclosed herein). The ESD manager 110 may be configured to determine CC metrics 128 for charge configurations 121 of respective charge operations. In some examples, the ESD manager 110 may be further configured to manage and/or control charge operations. The ESD manager 110 may configure the charging device 130 to implement charge operations having charge-related aging costs (CC metrics 128) below determined charge cost (CC) thresholds 129. In some examples, implementing a charge operation on an ESD 150 may comprise: a) determining a first charge configuration 121 for the charge operation; b) determining CC metrics 128 for the first charge configuration 121; and c) evaluating the first charge configuration 121 based on, inter alia, the determined CC metrics 128 and/or corresponding CC thresholds 129. The first charge configuration 121 may be determined based on, inter alia, characteristics of the ESD 150 to be charged (e.g., ESD-type characteristics, ESD-specific characteristics, and/or the like). Determining the first charge configuration 121 may further comprise selecting a first charge rate for the charge operation based on, inter alia, a maximum charge rate for the ESD 150. Determining CC metrics 128 for the first charge configuration 121 may comprise receiving, extracting and/or otherwise determining a set of charge conditions 124 corresponding to the first charge configuration 121. Evaluating the first charge configuration 121 may comprise determining whether the CC metrics 128 satisfy one or more charge cost CC thresholds 129, which may be configured to define upper limits for aging imposed by charge operations implemented by the charging device 130 (and/or upper limits for aging imposed by charge operations performed on the ESD). In some examples, the CC thresholds 129 may be expressed in terms of one or more $M_{ch}$ quantities; the CC thresholds 129 may include, but are not limited to: nominal $M_{ch}$ quantities (indicating nominal and/or acceptable charge-related aging); moderate $M_{ch}$ quantities (indicating moderately high levels of charge-related aging); high $M_{ch}$ quantities (indicating high levels of charge-related aging); unacceptable $M_{ch}$ quantities (indicating unacceptably high charge-related aging and/or damage potential); dangerous $M_{ch}$ quantities (extremely high aging and/or high probability of damage and/or failure), and/or the like.

Evaluating the first charge configuration 121 may comprise determining whether to implement the first charge configuration 121 as defined. The first charge configuration 121 may be implemented in response to, inter alia, determining that the $M_{ch}$ quantity determined for the first charge configuration 121 (the CC metric 128 for the first charge configuration 121 determined per the aging model 125) is at or below nominal and/or moderate $M_{ch}$ quantities of the CC thresholds 129. The evaluating may further comprise determining to modify and/or reject the first charge configuration 121 in response to determining that the $M_{ch}$ quantity of the first charge configuration 121 fails to satisfy the nominal and/or moderate $M_{ch}$ quantities of the CC thresholds 129 (and/or exceeds high, unacceptable and/or dangerous $M_{ch}$ quantities of the CC thresholds 129). The modifying may comprise changing one or more conditions of the charge operation, such as charge rate $r_{ch}$, target charge voltage $V_{ch}$, charge temperature $T_{actual}$, and/or the like. The modifying may comprise determining a second charge configuration 121 having a reduced charge rate $r_{ch}$, reduced target charge voltage $V_{ch}$, and/or increased charging temperature $T_{actual}$ relative to the first charge configuration 121. The ESD manager 110 may determine CC metrics 128 for the second charge configuration 121, which may be used to determine whether to implement the second charge configuration 121 and/or apply further modifications (to further reduce the CC metrics 128), as disclosed herein. As disclosed above, increasing the charging temperature $T_{actual}$ may reduce detrimental cell polarization that can build during higher charge rates and lead to harmful metal dendrite formation. It is recognized, however, that higher temperatures may accelerate other degradation mechanisms and related aging. The ESD manager 110 may, therefore, be configured to modify charge temperatures $T_{actual}$ within specified bounds (per reference temperatures $T_{ref}$ of the ESD 150).

The ESD manager 110 may be configured to cause the charging device 130 to implement charge operations on ESD 150. The ESD manager 110 may cause the charging device 130 to implement charge operations in accordance with charge configurations 121 determined and/or modified by the ESD manager 110. In some implementations, the ESD manager 110 is configured to generate charge instructions 131, the charge instructions 131 configured to cause the charging device 130 to implement charge operations on ESD 150 in accordance with charge configurations 121 determined for the ESD 150. The charge instructions 131 generated for a charge configuration 121 may be configured to cause the charging device 130 (or other charging mechanism) to implement the charge operation defined by the charge configuration 121 (e.g., implement the charge operation defined and/or specified by the charge-operation characteristics of the charge configuration 121). The charge instructions 131 may include any suitable information for configuring, managing, controlling, and/or otherwise causing the charging device 130 (or other charging mechanism) to implement a charge operation, including, but not limited to: charging device configuration data, charging device commands, a command sequence, charging device directives, charging device instructions, an instruction sequence, a charging specification, charging device settings, machine-readable instructions, computer-readable instructions, executable instructions, a script, and/or the like.

Figure 1B:
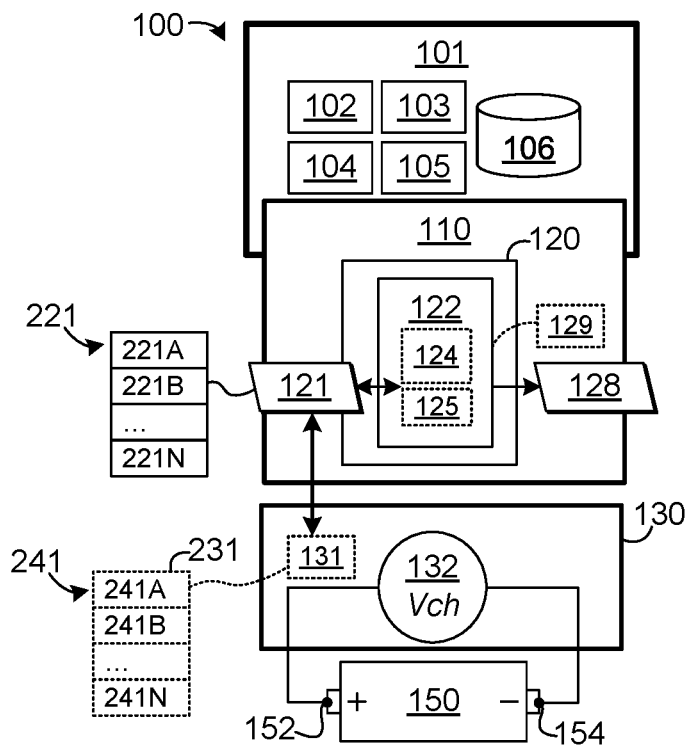
FIG. 1B illustrates an example of a system for managing multi-step charge operations.

FIG. 1B illustrates an example of a system 100 for managing ESD 150 and, in particular, managing multi-step charge operations on such devices. The system 100 may comprise an ESD manager 110 configured to determine CC metrics 128 for specified charge configurations 121 and/or charge conditions 124 in accordance with an aging model 125. The ESD manager 110 may be further configured to modify and/or control the charge configuration 121 of a charge operation to, inter alia, manage aging imposed by the charge operation, as disclosed herein. The ESD manager 110 may be configured to ensure that charge operations performed by the charging device 130 do not have CC metrics 128 that exceed one or more CC thresholds 129. The ESD manager 110 may be configured to modify charge configurations 121 of the charging device 130 in order to reduce the CC metrics 128 thereof. As illustrated above, the CC metrics 128 for a specified set of charge conditions 124 may be a function of the SoC and/or voltage range of the charge operation (e.g., the range of SoC from the starting SoC of the ESD 150 to the target SoC of the ESD 150 and/or difference between $V_{start}$ and $V_{ch}$ in the b, c, and d terms calculated in Eqs. 3-5).

In the FIG. 1B example, the ESD manager 110 may be further configured to determine CC metrics 128 for charge operations performed in a plurality of charging steps, each configured to charge a specified ESD 150 through a respective SoC and/or voltage range during a respective time. Implementing a charge operation in a plurality of charging steps may enable the charge operation to be performed more quickly and/or at lower CC metrics 128 (at the same or lower charge time as single-step charge operations). Each step of a multi-step charge operation may be performed under respective charge conditions 124. A charge configuration 121 for a multi-step charge operation may, therefore, comprise a plurality of step configurations 221, each pertaining to a respective one of N steps comprising the multi-step charge operation (e.g., step configurations 221A-N).

In the FIG. 1B example, the CRA modeler 122 may comprise an aging model 125 configured to determine CC metrics 128 for a charge configuration 121 (and/or corresponding multi-step charge configuration 121) comprising two steps, as follows:

$$M_{ch} = M_{ch}^o \left\{ x_{t1} \left\{ f_{SOC\_1} \left[ 1 - \exp\left(-\alpha_1 \left(\frac{2r_{ch\_1}}{r_{ch\_max}}\right)^{\frac{1}{b_1}}\right) \right] \right\}_1 + x_{t2} \left\{ f_{SOC_2} \left[ 1 - \exp\left(-\alpha_2 \left(\frac{2r_{ch\_2}}{r_{ch\_max}}\right)^{\frac{1}{b_2}}\right) \right] \right\}_2 \right\}$$
Eq. 7

In Eq. 7, $x_{t1}$ and $x_{t2}$ are relative time portions of the charge operation that are occupied by steps 1 and 2, respectively. Step 1 ($x_{t1}$) may comprise charging an ESD 150 from a specified start voltage $V_{start}$ to a target voltage of the step ($V_{ch\_i}$), which may be between $V_{start}$ and the target voltage of the charging operation ($V_{ch}$, such that $V_{start} < V_{ch\_1} < V_{ch}$). The interim voltage of the ESD 150 at the end of step 1 ($V_{ch\_i}$) will be $V_{start}$ for the second step ($x_{t2}$), which may charge the ESD 150 to the target voltage ($V_{ch}$, where $V_{start} < V_{ch\_1} < V_{ch\_2} \approx V_{ch}$). Likewise, charging rates $r_{ch\_1}$ and $r_{ch\_2}$ are allowed to vary within each charge step. In some examples, a rest period may be interposed between steps, wherein ESD aging is estimated to be minimal at the SoC of step 1. The approach illustrated in Eq. 7 may be applied to multi-step charge operations comprising any number of steps.

The aging model 125 may be configured to determine cost metrics for multi-step charge operations as follows:

$$M_{ch} = M_{ch}^o \left\{ \sum_i^N x_{ti} \left( f_{SOC\_i} \left[ 1 - \exp\left(-\alpha_i \left(\frac{2r_{ch\_i}}{r_{ch\_max}}\right)^{\frac{1}{b_i}}\right) \right] \right)_i \right\}$$
Eq. 8

$$f_{SoC\_i} = \frac{b_i}{2}\left(1 + (c_i * d_i)^{\frac{1}{2}}\right)$$
Eq. 9

$$b_i = \frac{(V_{max} - V_{min})}{\frac{1}{2}(V_{max} + V_{min})} \left(\frac{V_{ch\_i} - V_{min}}{V_{max} - V_{ch\_i} + \Delta V_{pol}}\right)^{\frac{1}{V_{ch\_i}}}$$
Eq. 10

$$c_i = \frac{(V_{ch\_i} - V_{start\_i})}{(V_{ch\_i} - V_{min})}$$
Eq. 11

$$d_i = \frac{V_{ch\_i}}{V_{max}}$$
Eq. 12

$$\alpha_i = f_T\left(\frac{T_{ref}}{T_{actual\_i}}\right)$$
Eq. 13

In Eq. 8, $x_{ti}$ is a relative time portion occupied by the ith of N steps of the multi-step charge operation, which may impose a charge cost in accordance with respective charge conditions 124 during the ith step, such as the voltage of the ESD 150 at the start of $x_{ti}$ ($V_{start\_i}$), the target voltage at the end of $x_{ti}$ ($V_{ch\_i}$), the charge rate during $x_{ti}$ ($r_{ch\_i}$), a temperature of the ESD 150 during $x_{ti}$ ($T_{actual\_i}$), and so on. The step-specific voltage quantities, such as $V_{start\_i}$ and/or $V_{ch\_i}$ may be replaced with SoC quantities (e.g., values between 0 and 1), as disclosed herein.

The ESD manager 110 may be configured to modify charge configurations 121 for charge operations to be performed by the charging device 130 (e.g., on an ESD 150). In the FIG. 1B example, the ESD manager 110 may be configured to modify a first charge configuration 121 in response to determining that CC metrics 128 of the first charge configuration 121 exceed one or more CC thresholds 129. The modifying may comprise determining a second charge configuration 121. The second charge configuration 121 may comprise a multi-step charge configuration 121, as disclosed herein. The second, multi-step charge configuration 121 may be configured to charge the ESD 150 through a voltage and/or SoC range in a plurality of steps, each step having respective charge conditions 124 (and resulting in respective degrees of aging). The second, multi-step charge configuration 121 may be configured to result in a lower charge time and/or lower CC metrics 128 than the first charge configuration 121. Alternatively, or in addition, the ESD manager 110 may be configured to determine CC metrics 128 for respective steps of a multi-step charge operation, each set of CC metrics 128 quantifying aging imposed by charging under the specified charge conditions 124 of the respective step. The ESD manager 110 may be configured to modify a multi-step charge operation, which may comprise modifying charge conditions 124 of one or more of the steps (e.g., modifying target voltage, charge rate, temperature, and/or the like).

The ESD manager 110 may implement charge operations on ESD 150 in accordance with charge configurations 121 determined for the ESD 150 (e.g., per charge-operation characteristics of the charge configurations 121). The charge operations implemented by the ESD manager 110 may include multi-step charge operations, as disclosed herein. Implementing a multi-step charge operation on an ESD 150 may comprise generating charge instructions 131, the charge instructions 131 configured to cause the charging device 130 (or other charging mechanism) to implement the multi-step charge operation. In the FIG. 1B example, the charge instructions 131 generated by the ESD manager 110 to implement the multi-step charge operation specified by the charge configuration 121 may comprise, define, and/or specify a command sequence 231. The command sequence 231 may comprise a plurality of charge step commands 241, each charge step command 241 corresponding to a respective one of the step configurations 221 of the charge configuration 121. The charge instructions 131 may, therefore, be configured to cause the charging device 130 (or other charging mechanism) to implement each step of the multi-step charge operation specified by the charge configuration 121 (in the sequence specified by the charge configuration 121). As illustrated in FIG. 1B, the charge instructions 131 may define a command sequence 231 comprising charge step commands 241A through 241N, which may be configured to cause the charging device 130 to implement the sequence of charge operations defined by step configurations 221A through 221N of the charge configuration 121.

Figure 1C:
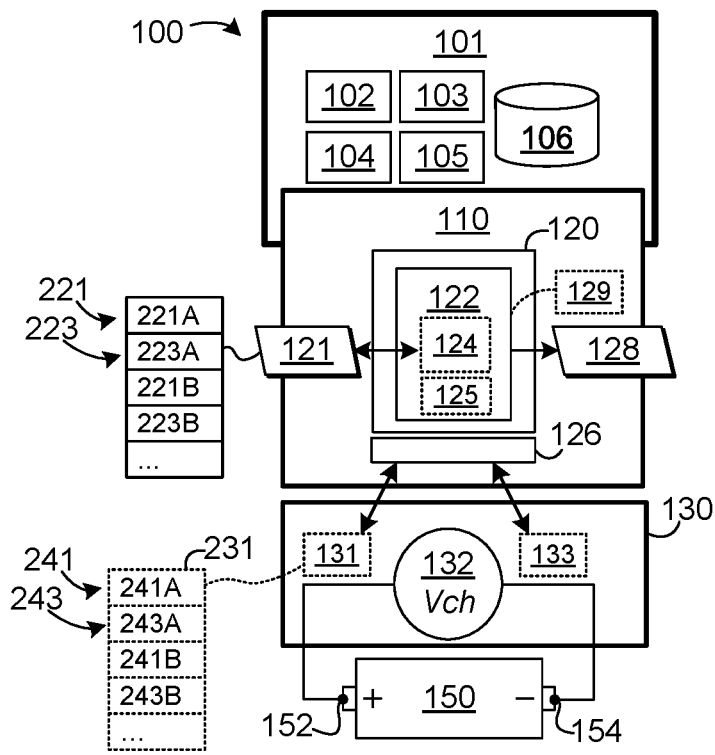
FIG. 1C illustrates another example of a system for managing multi-step charge operations.

FIG. 1C illustrates an example of a system 100 for managing charge operations on ESD 150 based, at least in part, on conditions in which the ESD 150 were maintained prior to such charge operations. In the FIG. 1C example, the ESD manager 110 may be configured to manage charge operations on one or more ESD 150. The ESD manager 110 may be configured to quantify aging imposed by specified charge configurations 121 and/or modify the charge configurations 121 to, inter alia, reduce charge-relating aging imposed on the ESD 150. The ESD manager 110 may be configured to quantify aging costs incurred by subjecting the ESD 150 to multi-step charge operations (e.g., charge operations implemented per charge configurations 121 comprising a plurality of step configurations 221). The ESD manager 110 may be further configured to convert single step charge configurations 121 to multi-step charge configurations 121 (or vice versa) and/or modify respective steps of multi-step charge configurations 121, as disclosed herein.

In the FIG. 1C example, the aging model 125 may be further configured to model charge-related aging incurred during rest periods between respective steps of multi-step charge operations. A rest period is defined herein as a time interval wherein there is cessation of active charging and discharging of an ESD 150 within typical duty cycle conditions. That is, no charge or discharge current is enacted from the charging device 130 toward the ESD 150 that would alter the present-time SoC. Within this definition, a rest step may be a condition whereby the ESD 150 is placed in an open-circuit voltage (OCV) state, or a condition whereby the ESD 150 is maintained at constant SoC by application of a small "trickle charge" or "taper charge", or the like. The time spent at respective SoC (and/or interim and/or $V_{ch}$) during multi-step charge operations may influence the realized extent of charge-related aging ($M_{ch}$). The rate of aging during rest periods may be independent of the cycling rate or the number of preceding charge steps. The CRA modeler 122 may define conditions that correlate with aging during rest periods, such as SoC, temperature, rest period duration, and so on. As illustrated in FIG. 1C, a charge configuration 121 may specify conditions during respective steps (step configurations 221A and 221B), and conditions during rest periods between respective steps (rest-period configuration 223). A rest-period configuration 223 may represent and/or specify a rest period of zero or more seconds between specified charging steps (step configurations 221). The aging model 125 of the CRA modeler 122 may be further configured to model aging contributions of charge and rest-period conditions, which may have same and/or overlapping mechanistic outcomes. The ESD aging extent (A) due to charge conditions 124 on the ESD 150 during respective steps, and (B) conditions during rest-periods between respective steps may both reside within the same general category of aging mechanisms that impact the anode of the ESD 150. As such, the outcomes of (A) and (B) may not be strictly additive, but may be super-positional in part, where the greater of the two will dominate the overall $M_{ch}$ term. The CRA modeler 122 may, therefore, configure the aging model 125 to avoid "double-counting" the effects of aging by two or more sets of linked conditions that contribute to the same aging mechanisms (e.g., avoid double counting aging due to charge conditions 124 and/or rest-period conditions), as follows:

$$M_{ch} = M_{ch}^o \left\{ \begin{array}{l} \left[ x_{t1}\left( f_{SOC_1}\left[ 1 - \exp\left(-\alpha_1 \left(\frac{2r_{ch_1}}{r_{ch\_max}}\right)^{\frac{1}{b_1}}\right)\right]\right) \right]_1 + \\ \left[ y_{t3}\left( g_3 * \exp\left(\frac{1}{\alpha_3}\left(1 - \frac{1}{b_3}\right)\right)\right) \right]_3 + \\ \left[ x_{t2}\left( f_{SOC_2}\left[ 1 - \exp\left(-\alpha_2 \left(\frac{2r_{ch_2}}{r_{ch\_max}}\right)^{\frac{1}{b_2}}\right)\right]\right) \right]_2 + \\ \left[ y_{t4}\left( g_4 * \exp\left(\frac{1}{\alpha_4}\left(1 - \frac{1}{b_4}\right)\right)\right) \right]_4 \end{array} \right\}$$

Eq. 14

In an aging model 125 corresponding to Eq. 14, the $M_{ch}$ quantity represents the maximum extent to which a specified ESD 150 is predicted to age in response to being subjected to specified charge conditions 124, including aging due to one or more charging steps and one or more rest periods. As disclosed above, $x_{t1}$ and $x_{t2}$ parameters are the relative time proportions of total charge time occupied by steps 1 and 2, respectively. The $y_{t3}$ parameter is the proportion of time spent in a rest period between steps 1 and 2 compared to the combined charge steps 1 and 2 (or any n number of steps). The $y_{t4}$ parameter is the proportion of time spent in a rest period after step 2 (or final n step) compared to the combined charge steps 1 and 2 (or any n number of steps). The parameters $g_3$ and $g_4$ are of the aging model 125 may represent material specific terms that reflect sensitivity of the materials comprising the ESD 150 (e.g., cathode and anode) to temperature in terms of aging mechanisms. Elevated temperatures that might exist during the indicated rest periods would cause accelerated aging and be accounted for in the magnitude of $g_3$ and $g_4 \ldots g_n$. The charge steps $x_{t1} \ldots x_{tn}$ may sum to unity, whereas the $y_t$ term may be independent, but defined relative to $x_{t1} \ldots x_{tn}$. By way of non-limiting example, if steps 1 and 2 were each 2 hours, and the rest period were 8 hours, the $x_{t1}$ and $x_{t2}$ terms of Eq. 14 would be 0.5, and the $y_{t3}$ term would be 4. Although Eq. 14 is defined in terms of rest periods of a two-step charge operation, the disclosure is not limited in this regard and could be adapted to incorporate aging models 125 configured to model charge operations having any number of steps and/or rest periods.

In the FIG. 1C example, the CC metrics 128 determined by the age modeling engine 120 per the aging model 125 (e.g., the $M_{ch}$ quantities for respective charge configurations 121) may quantify the maximum extent of charge-related aging due to multi-step charge operations, including rest periods between respective steps. A charge configuration 121 may, therefore, comprise: a) information pertaining to respective steps of the charge operation to be performed on the specified ESD 150 (e.g., step configurations 221A and 221B), and b) information pertaining to conditions during rest period(s) between and/or respective steps (e.g., rest-period configurations 223). In the FIG. 1C example, the rest-period configuration 223A may indicate conditions during a first rest period after a first charge step, such as the SoC and/or voltage of the ESD 150 (the interim and/or $V_{ch}$ of step 1), temperature of the ESD 150 during the first rest period, the duration of the first rest period, and so on, as disclosed herein. The rest-period configuration 223 may indicate conditions during a second rest period after a second charge step, and so on. The CRA modeler 122 may use the charge configuration 121, including the step configurations 221A-B and the rest-period configurations 223A-B to determine a CC metric 128 (e.g., $M_{ch}$ quantity) for the multi-step charge operation, per the aging model 125 (e.g., in accordance with Eq. 14). In the FIG. 1C example, the ESD manager 110 may be configured to modify charge configurations 121 based on CC metrics 128 determined for multi-step charge configurations 121. The ESD manager 110 may modify a charge configuration 121 to, inter alia, reduce the CC metrics 128 thereof, which may comprise modifying charge conditions 124 of one or more charge steps (e.g., step configurations 221) and/or one or more rest periods between respective steps (e.g., rest-period configurations 223).

As disclosed herein, the ESD manager 110 may be configured to implement charge operations on ESD 150 in accordance with charge configurations 121 determined for the ESD 150 (e.g., per charge-operation characteristics of the charge configurations 121). The charge operations implemented by the ESD manager 110 may include multi-step charge operations having one or more rest periods. Implementing a multi-step charge operation on an ESD 150 may comprise generating charge instructions 131, the charge instructions 131 configured to cause the charging device 130 (or other charging mechanism) to implement the multi-step charge operation. In the FIG. 1C example, the charge instructions 131 generated by the ESD manager 110 to implement the multi-step charge operation specified by the charge configuration 121 may comprise, define, and/or specify a command sequence 231. The command sequence 231 may comprise a plurality of charge step commands 241, each charge step command 241 corresponding to a respective one of the step configurations 221 of the charge configuration 121. The command sequence 231 may further include one or more rest commands 243, each rest command 243 corresponding to a respective one of the rest-period configurations 223 of the charge configuration 121. The charge instructions 131 may, therefore, be configured to cause the charging device 130 (or other charging mechanism) to implement each step of the multi-step charge operation specified by the charge configuration 121 and/or include rest periods between one or more of the steps (in the sequence specified by the charge configuration 121).

As illustrated in FIG. 1C, the command sequence 231 defined by the charge instructions 131 may include: charge step command 241A, which may be configured to cause the charging device 130 to implement a first step of the multi-step charge operation in accordance with step configuration 221A; rest command 243A, which may be configured to cause the charging device 130 to implement a first rest period following completion of the first step in accordance with the rest-period configuration 223A; charge step command 241B, which may be configured to cause the charging device 130 to implement a second step of the multi-step charge operation per step configuration 221B following the first rest period; rest command 243B, which may be configured to cause the charging device 130 to implement a second rest period following completion of the second step in accordance with the rest-period configuration 223B; and so on.

In some implementations, the ESD manager 110 may further include and/or be coupled to an interface 126. The interface 126 may be configured to couple the ESD manager 110 to an ESD interface device, such as the charging device 130. The ESD manager 110 may utilize the interface 126 to, inter alia, implement charge operations on ESD 150. The interface 126 may be configured to communicate charge instructions 131 generated by the ESD manager 110 to the charging device 130 and/or configuring the charging device 130 to implement the charge instructions 131. In some implementations, the interface 126 may be configured to configure charge instructions 131 for execution of the charging device 130. The interface 126 may be configured to generate, convert, format, package and/or otherwise produce charge instructions 131 adapted for execution by the charging device 130. The interface 126 may be configured to couple the ESD manager 110 to a plurality of ESD interfaces (e.g., a plurality of different charging devices 130) and may be configured for produce charge instructions 131 adapted for execution by the respective ESD interfaces.

In some aspects, the interface 126 may be further configured to acquire ESD data 133 from the ESD 150 and/or one or more ESD interface devices, such as the charging device 130. The ESD data 133 may include any suitable information pertaining to the ESD 150 coupled to the charging device 130, an operation being performed on the ESD 150, ESD performance characteristics, and/or the like. The ESD data 133 acquired by the interface 126 may include, but is not limited to: an identifier of the ESD 150, a voltage or SoC of the ESD 150, an impedance of the ESD 150, a temperature of the ESD 150, the charge rate of a charge operation being performed on the ESD 150, the discharge rate of a discharge operation being performed on the ESD 150, an input voltage to the ESD 150, an output voltage of the ESD 150, and/or the like. The CRA modeler 122 may utilize the ESD data 133 to develop and/or refine charge configurations 121, charge conditions 124, CC metrics 128, and/or other age-related model(s) associated with the ESD 150.

In some implementations, the ESD data 133 may include measurements pertaining to one or more ESD performance characteristics, such as ESD capacity, charge acceptance, charge retention, power delivery, internal impedance, ESD voltage, cell voltage, frequency of self-discharge, temperature rise during operation, temperature rise during charge operations (at specified charge rates), temperature rise during discharge operations (at specified discharge rates), and/or the like. The CRA modeler 122 may utilize the ESD data 133 to monitor, quantify, track, and/or model ESD performance degradation.

Figure 1D:
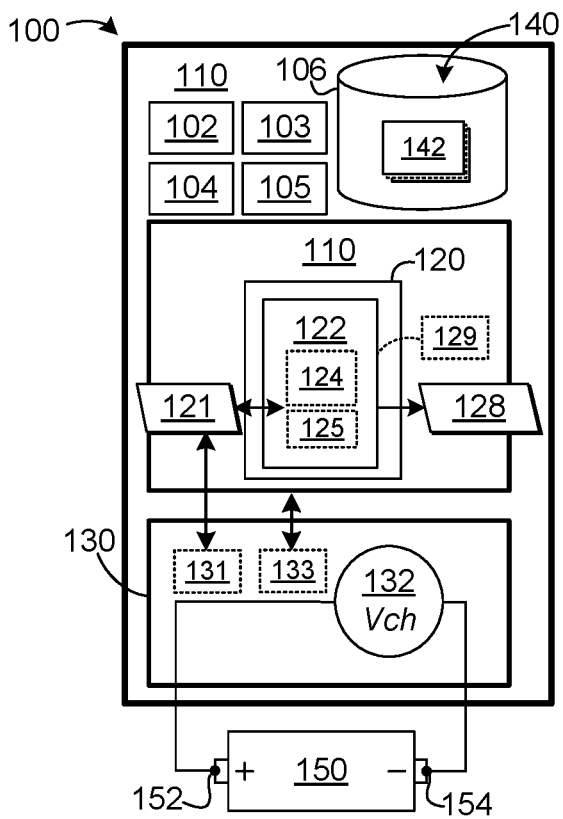
FIG. 1D illustrates further examples of systems for managing energy storage devices.

FIG. 1D illustrates another example of a system 100 for managing ESD 150. In the FIG. 1D example, the ESD manager 110 is configured to maintain ESD profile data (profile data 140). The profile data 140 may be maintained in persistent storage, such as non-transitory storage 106 of the computing device 101. The profile data 140 may comprise one or more ESD profiles 142, each comprising information pertaining to a respective ESD 150 (and/or ESD type). The ESD profiles 142 may include ESD-type characteristics for respective ESD 150, as disclosed herein. The ESD profile 142 of an ESD 150 may include any suitable ESD-type characteristic, including, but not limited to: a maximum voltage ($V_{max}$), a minimum voltage ($V_{min}$), information pertaining to ESD chemistry, information pertaining to materials used in ESD 150 of the specified ESD type (e.g., materials used in the anode and/or cathode), reference temperature(s), such as $T_{ref}$, maximum charge rate (e.g., $r_{ch\_max}$), maximum discharge rate, $C_1$ discharge rate, voltage to SoC conversion information, and so on. In some implementations, the ESD profiles 142 may further include ESD-specific information, as disclosed herein.

The ESD profiles 142 may further comprise information pertaining to charge-related aging behavior for respective ESD 150 (and/or ESD types). The ESD profiles 142 may define aging models 125 of respective ESD 150 (and/or ESD types). In some aspects, each ESD profile 142 may include CC metrics 128 (e.g., $M_{ch}$ quantities) configured to model charge-related ESD aging behavior under each of a plurality of different charge conditions 124 (and/or under each of a plurality of different charge configurations 121). Table 1 shows examples of $M_{ch}$ quantities determined for a designated ESD type by the ESD manager 110 (e.g., an aging model 125). The information represented in Table 1 may be included in the ESD profile 142 associated with the designated ESD type. The $M_{ch}$ quantities may be based, at least in part, on ESD-type characteristics determined for the designated ESD type (e.g., $V_{min}$=3.0V, $V_{max}$=4.2V, $M_{ch}^{o}$=0.3, and $r_{ch\_max}$=2). As illustrated in Table 1, the example $M_{ch}$ quantities may be configured to estimate and/or predict charge-related ESD aging behavior of ESD 150 of the designated ESD type in each of a plurality of cases A through G*, each case corresponding to a respective charge configuration 121 (and corresponding charge conditions 124):

TABLE 1

| Case | $V_{start}$ | $V_{ch}$ | $r_{ch}$ | b | c | d | $f_{SoC}$ | $M_{ch}$ | % of $M_{ch}^{o}$ |
|---|---|---|---|---|---|---|---|---|---|
| A | 3.0 | 3.7 | 1 | 0.38 | 1 | | 0.881 | 0.368 | 0.07 | 23 |
| B | 3.0 | 4.2 | 1 | 1 | 1 | 1 | 1 | 0.19 | 63 |
| C | 3.7 | 4.2 | 1 | 1 | 0.420 | 1 | | 0.823 | 0.156 | 52 |
| D | 3.7 | 4.1 | 2 | 0.59 | 0.364 | 0.976 | 0.471 | 0.136 | 45 |
| E | 3.3 | 4.2 | 2 | 1 | 0.75 | 1 | | 0.933 | 0.242 | 81 |
| F | 3.7 | 4.2 | 2 | 1 | 0.42 | 1 | | 0.823 | 0.213 | 71 |
| G* | — | 4.2 | — | — | — | — | — | 0.15 | 33 |

The $M_{ch}$ quantities of Table 1 may be calculated for charge operations performed at a determined temperature (e.g., where α=1). The disclosure is not limited in this regard, however. In some implementations, the ESD manager 110 may generate ESD profiles 142 that include other quantities (and/or other tables) configured to characterize charge-related aging behavior of respective ESD types at different charge temperatures (e.g., where α<1 (higher temperatures), where α>1 (lower temperatures), and/or the like). In case G, the parameter g for quantifying charge-related aging due to rest-period conditions per Eq. 14 may be 0.5.

Figure 3:
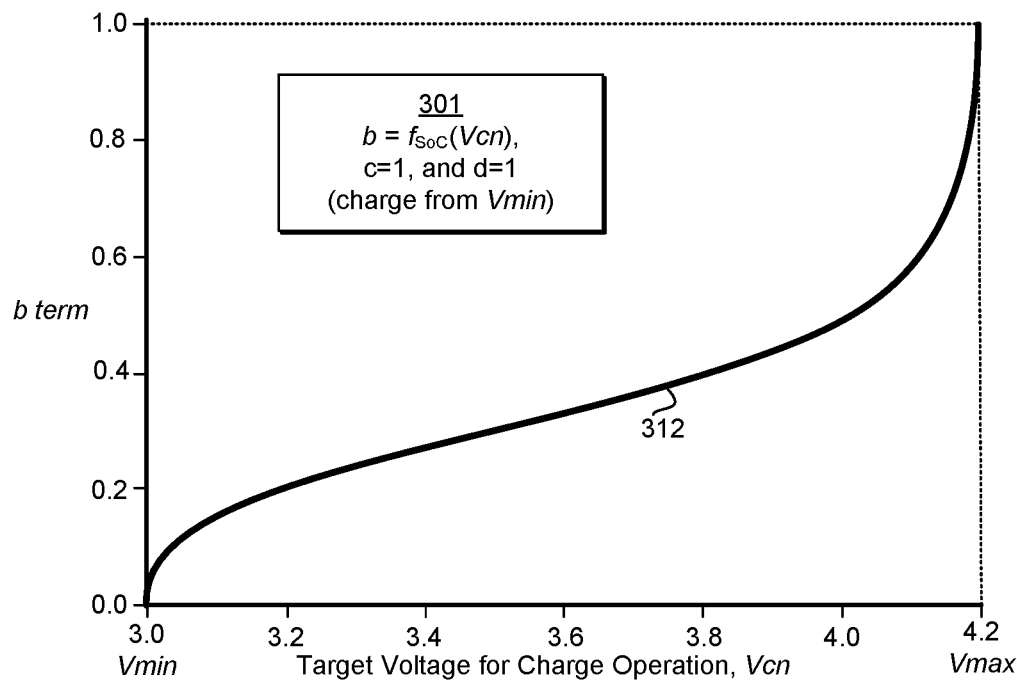
FIG. 3 is a plot illustrating example relationships between target voltages of charge operations and charge-related aging.

The aging model 125 defined by the ESD profile 142 of an ESD 150 may further quantify the effect of SoC on charge-related aging characteristics. The ESD profile 142 may indicate a degree to which $V_{ch}$ impacts resulting $M_{ch}$ quantities for the ESD 150. FIG. 3 is a plot 301 illustrating examples of relationships between charge rate and charge-related aging on an ESD 150 (per the ESD profile 142 thereof). The plot line 312 illustrates the impact of target voltage (FIG. 3 is a plot illustrating example relationships between target voltages of charge operations and charge-related aging.

Figure 4A:
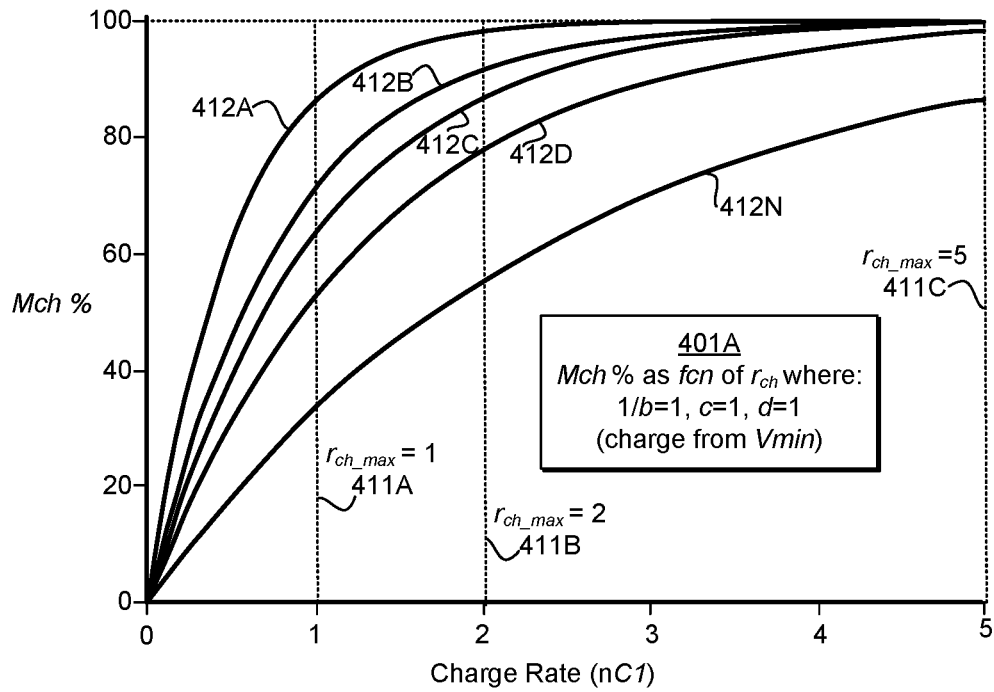
FIG. 4A illustrates a first example of an aging model configured to model relationships between charge rate and charge-related aging incurred by an energy storage device.

FIG. 4A illustrates a first example of an aging model configured to model relationships between charge rate and charge-related aging incurred by an energy storage device.

Figure 4B:
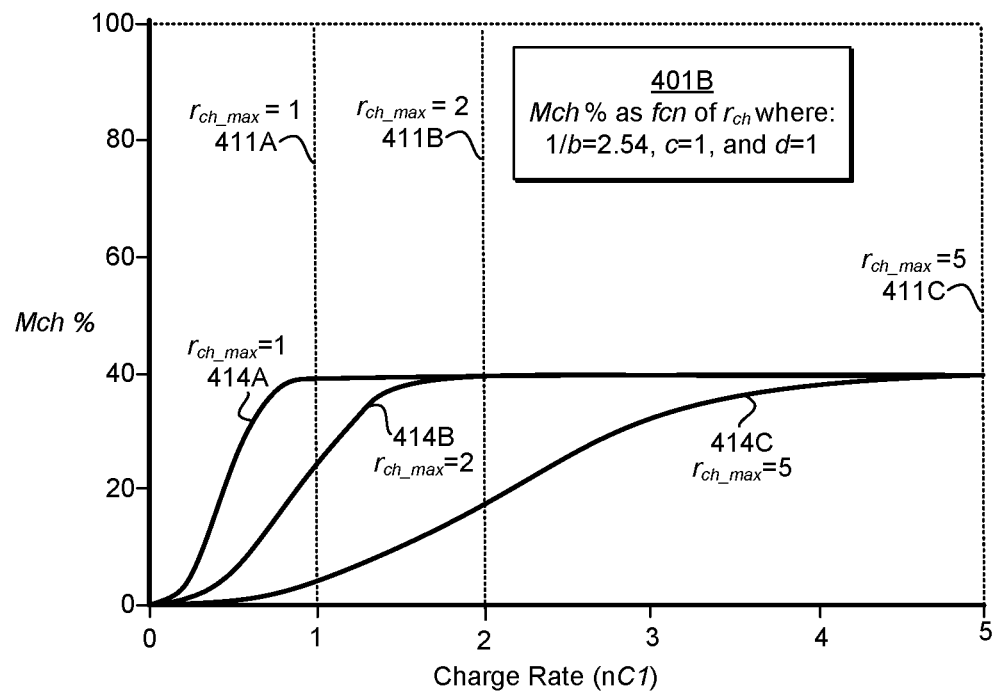
FIG. 4B illustrates a second example of an aging model configured to model relationships between charge rate and charge-related aging incurred by an energy storage device.

FIG. 4B illustrates a second example of an aging model configured to model relationships between charge rate and charge-related aging incurred by an energy storage device.

Figure 4C:
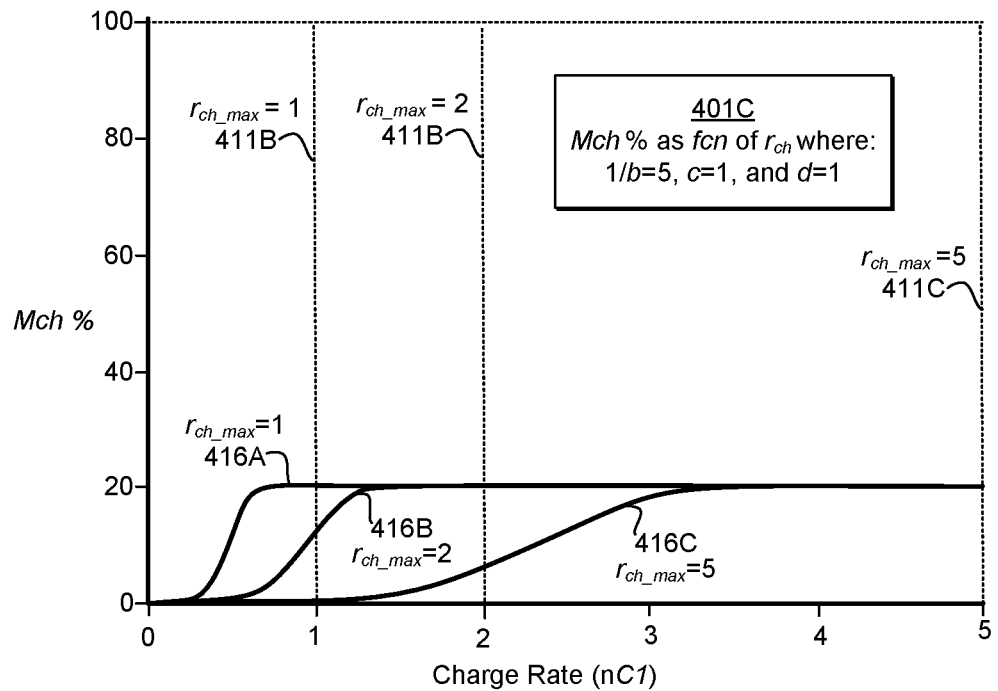
FIG. 4C illustrates a third example of an aging model configured to model relationships between charge rate and charge-related aging incurred by an energy storage device.

FIG. 4C illustrates a third example of an aging model configured to model relationships between charge rate and charge-related aging incurred by an energy storage device.

Figure 5:
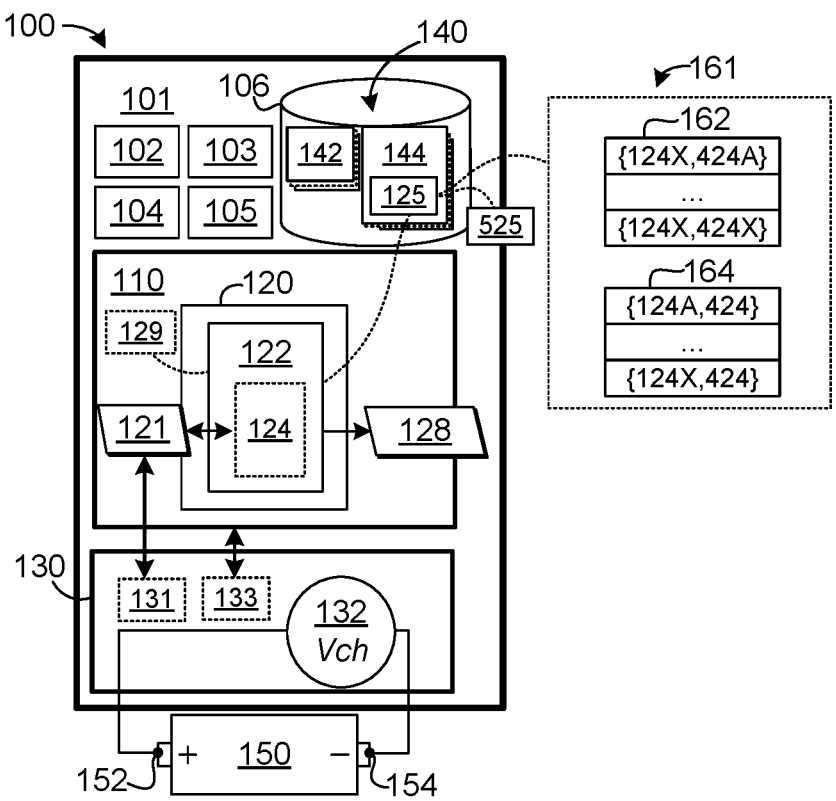
FIG. 5 illustrates another example of a system for managing energy storage devices.

FIG. 5 illustrates another example of a system for managing energy storage devices.

Figure 6:
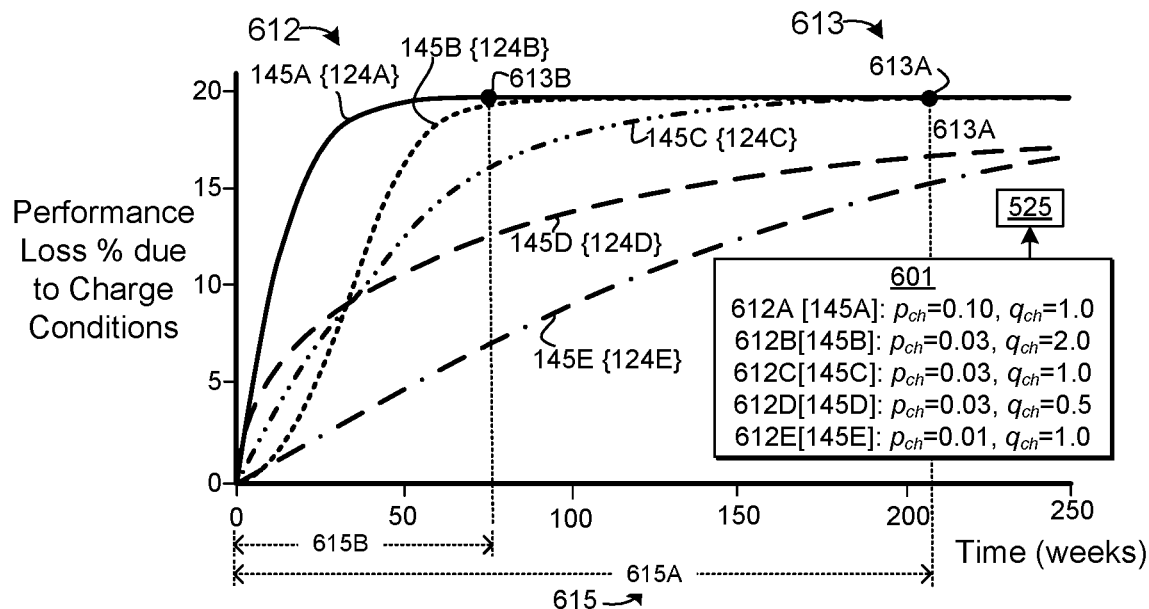
FIG. 6 is a plot illustrating further examples of aging models.

FIG. 6 is a plot illustrating further examples of aging models.

Figure 7A:
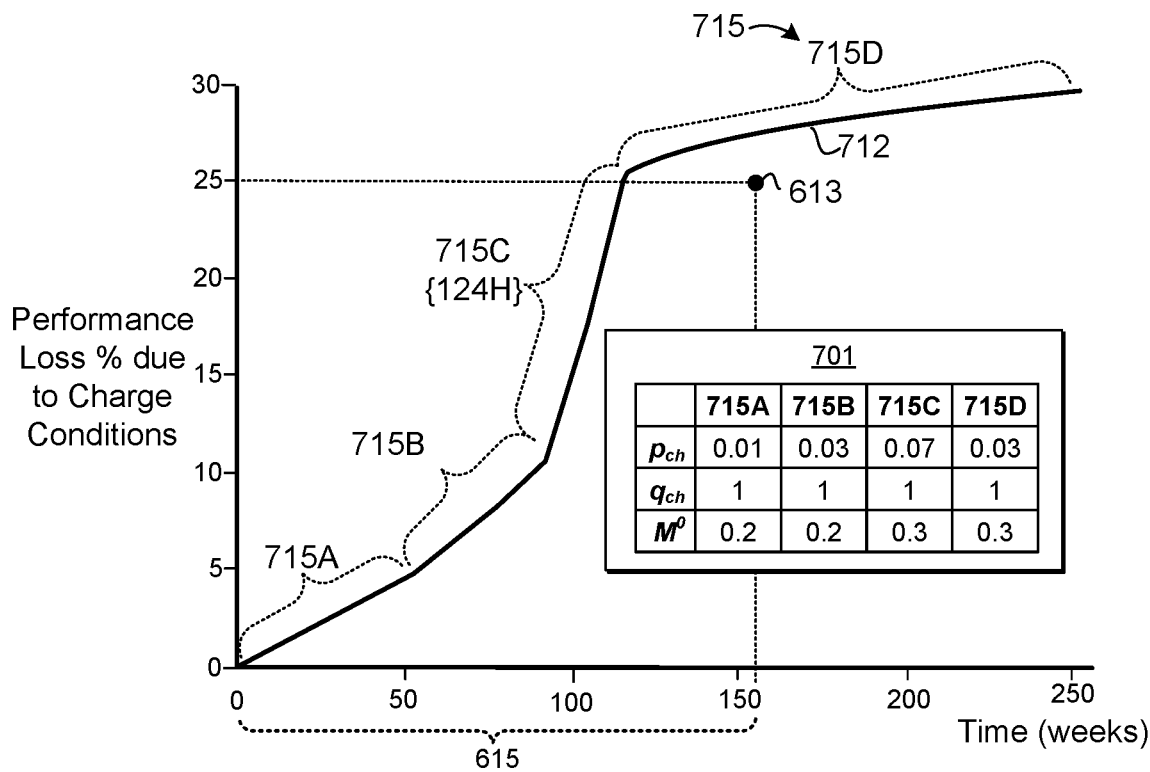
FIG. 7A illustrates an example of an aging model comprising a plurality of usage periods.

FIG. 7A illustrates an example of an aging model comprising a plurality of usage periods.

FIG. 7A illustrates another example of an aging model comprising a plurality of usage periods.

Figure 8:
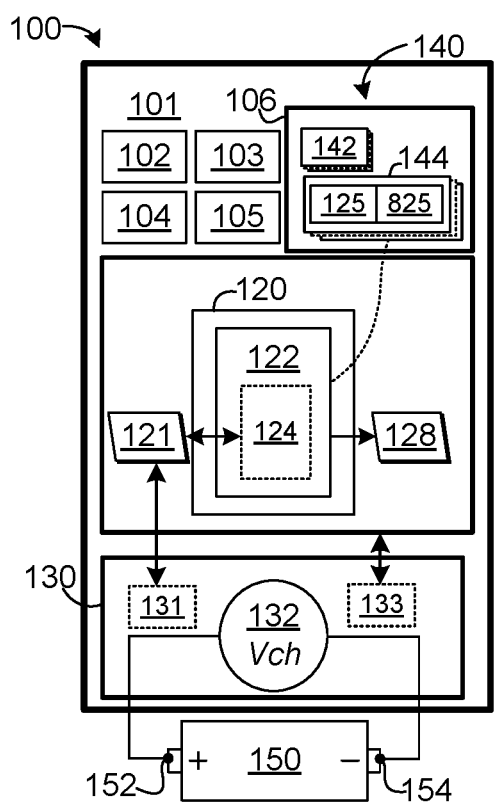
FIG. 8 illustrates an example of a system for managing energy storage devices in accordance with multi-mechanism age models.

FIG. 8 illustrates an example of a system for managing energy storage devices in accordance with multi-mechanism age models.

Figure 9:
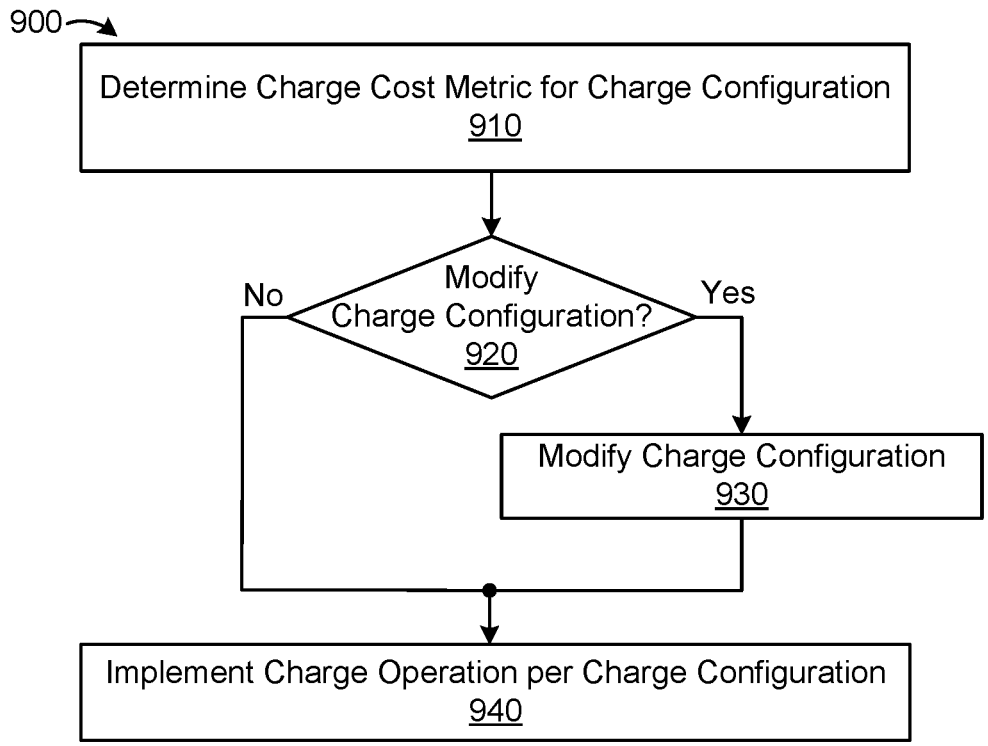
FIG. 9 illustrates a flow diagram of a first example of a method for managing charge operations implemented on energy storage devices.

FIG. 9 illustrates a flow diagram of a first example of a method for managing charge operations implemented on energy storage devices.

Figure 10:
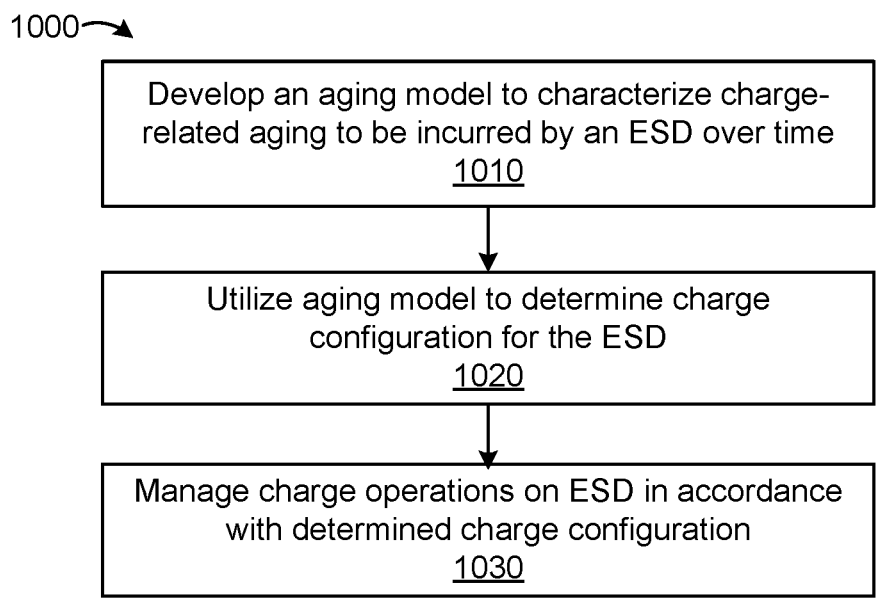
FIG. 10 illustrates a flow diagram of a second example of a method for managing energy storage devices.

FIG. 10 illustrates a flow diagram of a second example of a method for managing energy storage devices.

Figure 11:
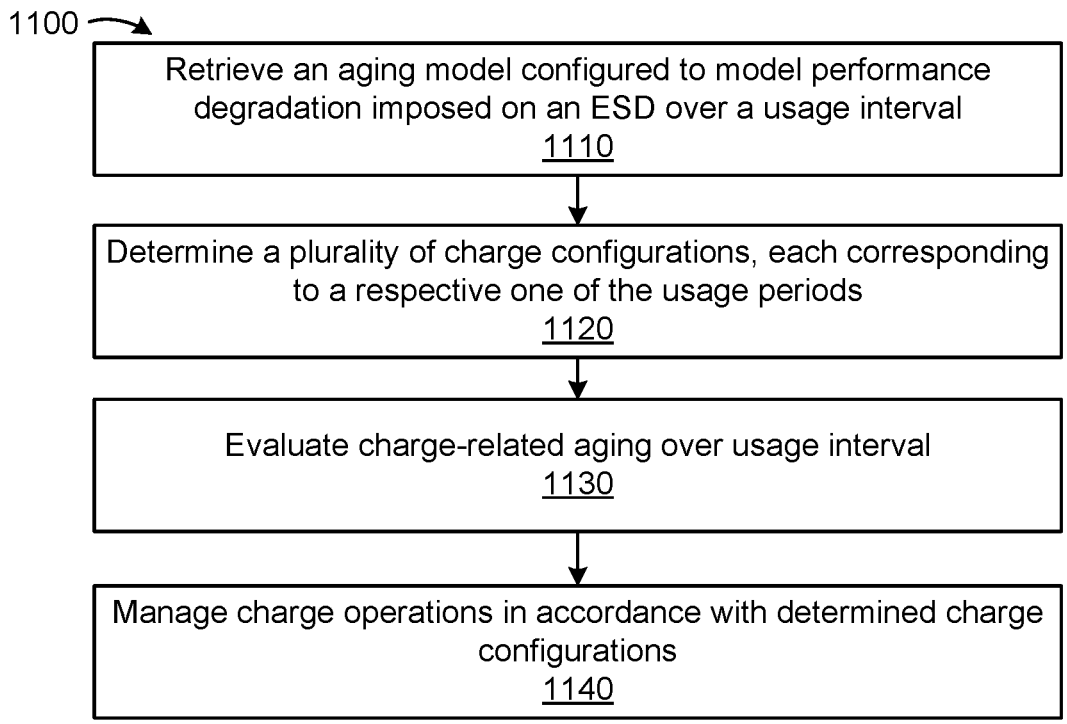
FIG. 11 illustrates a flow diagram of a third example of a method for managing energy storage devices.

FIG. 11 illustrates a flow diagram of a third example of a method for managing energy storage devices.

Figure 12:
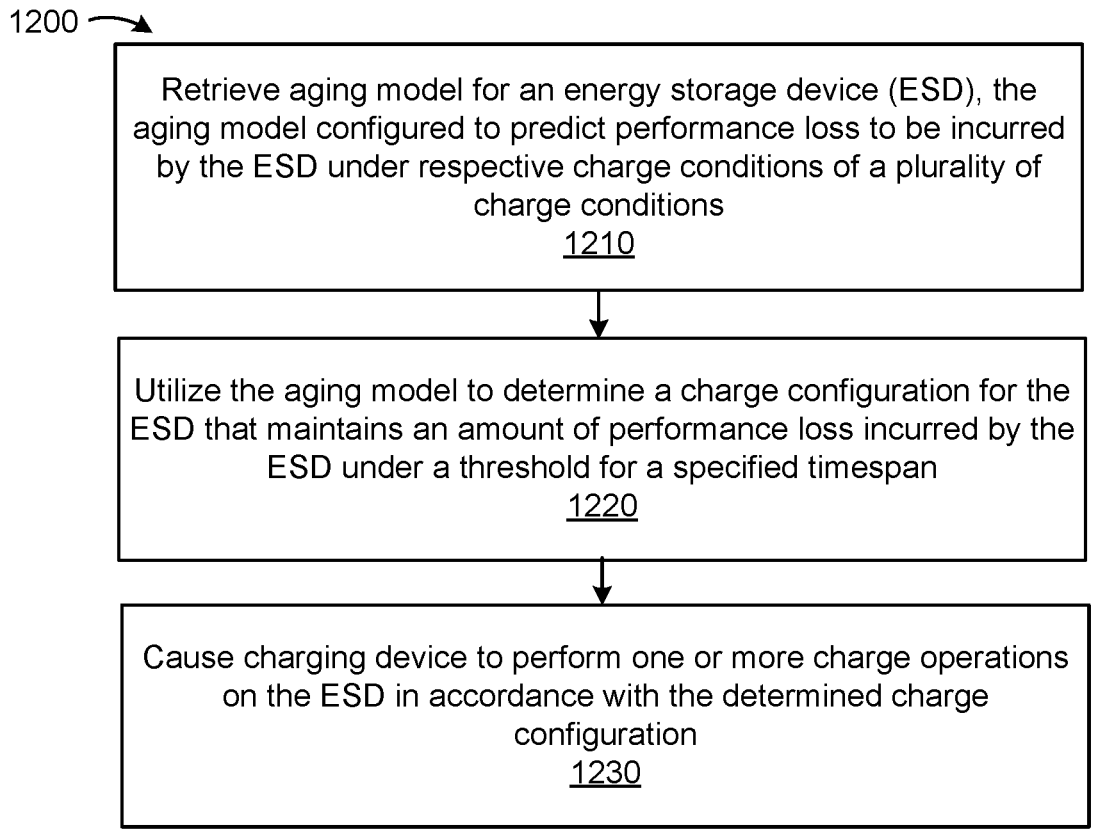
FIG. 12 illustrates a flow diagram of a fourth example of a method for managing energy storage devices.

FIG. 12 illustrates a flow diagram of a fourth example of a method for managing energy storage devices.

Figure 13:
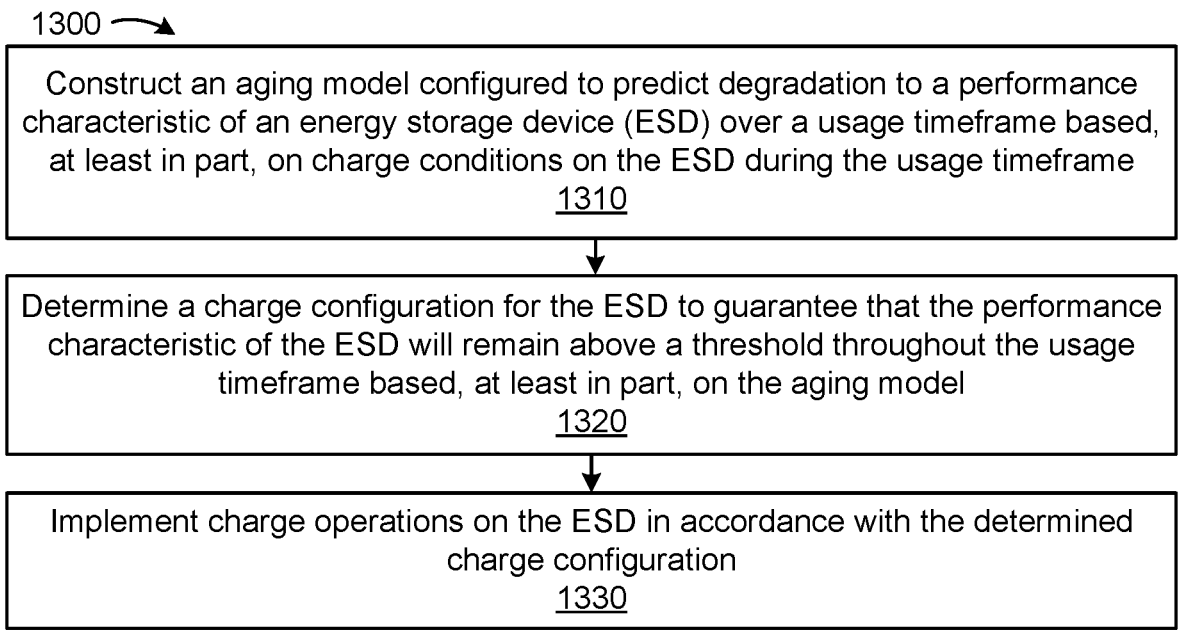
FIG. 13 illustrates a flow diagram of a fifth example of a method for managing energy storage devices.

FIG. 13 illustrates a flow diagram of a fifth example of a method for managing energy storage devices.

Figure 14:
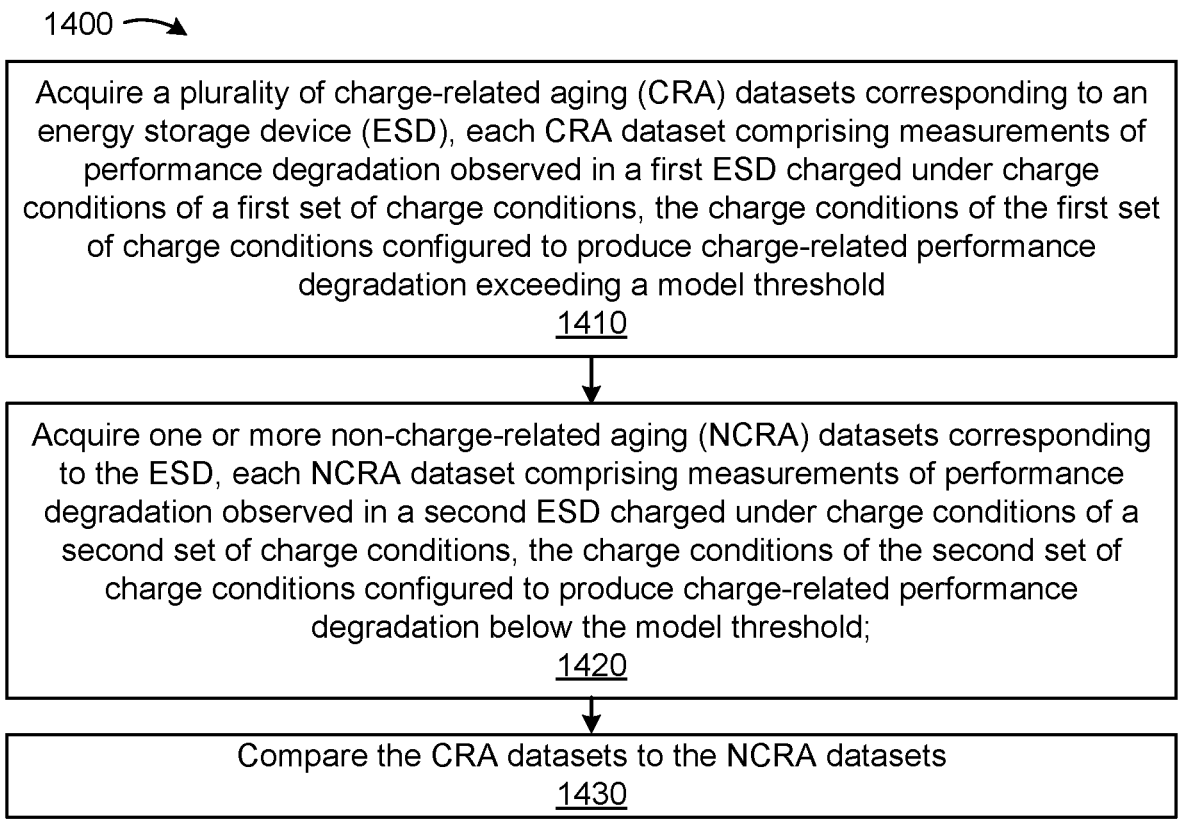
FIG. 14 illustrates a flow diagram of an example of a method for developing an aging model for an energy storage device (or type of energy storage device).

FIG. 14 illustrates .g., $V_{ch}$) on the b term used to calculate $M_{ch}$. The plot 301 may pertain to the ESD type of table 1 above (e.g., $V_{max}$=4.2, $V_{min}$=3.0). The b term may be calculated as a function of x ($V_{ch}$), as follows:

$$b(x) = \frac{(4.2 - 3.0)}{\frac{1}{2}(4.2 + 3.0)} \left( \frac{x - 3.0}{4.2 - x + 0.01} \right)^{\frac{1}{x}} \quad \text{Eq. 15}$$

The ESD manager 110 may use information pertaining to the illustrated relationships between $M_{ch}$ and $V_{ch}$ (and/or $V_{start}$-$V_{ch}$) in order to, inter alia, configure charge operations and/or respective steps of multi-step charge operations to reduce charge-related aging (e.g., configure voltage and/or SoC ranges of respective step configurations 221 to reduce charge-related ESD aging).

The aging model 125 developed by the ESD manager 110 may be further configured to quantify effects of charge rate ($r_{ch}$) on $M_{ch}$ (as quantified by $M_{ch}$ percentage, $M_{ch}$%). FIGS. 4A-4C are plot diagrams showing $M_{ch}$ % as a function of charge rate ($r_{ch}$) and target voltage ($V_{ch}$) for ESD 150 having different $r_{ch\_max}$ characteristics (and substantially the same capacity). The charge rates ($r_{ch}$) may be expressed in terms of $C_1$ rate (as n times the $C_1$ discharge rate of the ESD 150). The target voltage ($V_{ch}$) may be reflected in different b parameters for each plot 401A-C: plot 401A of FIG. 4A may illustrate $M_{ch}$ as a function of charge rate ($r_{ch}$) where 1/b=1; plot 401B of FIG. 4B may illustrate $M_{ch}$ as a function of charge rate ($r_{ch}$) where 1/b=2.54; and plot 401C of FIG. 4C may illustrate $M_{ch}$ as a function of charge rate ($r_{ch}$) where 1/b=5. The plots 401A-C further illustrate respective $r_{ch\_max}$ characteristics of an ESD 150 (411A illustrating $r_{ch\_max}$ at 1*$C_1$, 411B illustrating $r_{ch\_max}$ at 2*$C_1$, and 411C illustrating $r_{ch\_max}$ at 5*$C_1$). The $M_{ch}$ % quantities of FIGS. 4A-C may be calculated as a function of $V_{ch}$ (e.g., b) and charge rate $r_{ch}$ (x, expressed as $nC_1$), as follows (where 100 is a placeholder for the $M_{ch}$ maximum value based on total M):

$$M_{ch}\%(b, x) = 100 * b\left(1 - \exp\left(-\alpha\left(\frac{2x}{x_{max}}\right)^{\frac{1}{b}}\right)\right) \quad \text{Eq. 16}$$

Plot 401A of FIG. 4A comprises plot lines 412A-E, each illustrating $M_{ch}$ % as a function of charge rate ($r_{ch}$) for ESD 150 having different $r_{ch\_max}$ characteristics (charged over a range wherein 1/b=1): plot line 412A illustrates $M_{ch}$ % as a function of $r_{ch}$ for an ESD 150 having an $r_{ch\_max}$ of $1*C_1$, plot lines 412B-D show $M_{ch}$ % as a function of $r_{ch}$ for an ESD 150 having an $r_{ch\_max}$ of $2*C_1$; and plot line 412E shows $M_{ch}$ % as a function of $r_{ch}$ for an ESD 150 having an $r_{ch\_max}$ of $5*C_1$. The plot lines 412B-D show $M_{ch}$ % as a function of $r_{ch}$ for an ESD 150 having an $r_{ch\_max}$ of $2*C_1$ at different temperatures: plot line 412B corresponds to a of 1.25 (lower $T_{actual}$, resulting in higher levels of charge-related aging, $M_{ch}$), plot line 412B corresponds to a of 1; and plot line 412C corresponds to a of 0.75 (higher $T_{actual}$, resulting in lower levels of charge-related aging, $M_{ch}$).

Plot 401B of FIG. 4B comprises plot lines 414A-C, each illustrating $M_{ch}$ % as a function of charge rate ($r_{ch}$) for ESD 150 having different $r_{ch\_max}$ characteristics (charged over a range wherein 1/b=2.54 and α=1): plot line 414A illustrates $M_{ch}$ % as a function of $r_{ch}$ for the ESD 150 having an $r_{ch\_max}$ of $1*C_1$, plot line 414B shows $M_{ch}$ % as a function of $r_{ch}$ for the ESD 150 having an $r_{ch\_max}$ of $2*C_1$; and plot line 414C shows $M_{ch}$ % as a function of $r_{ch}$ for an ESD 150 having an $r_{ch\_max}$ of $5*C_1$.

Plot 401C of FIG. 4C comprises plot lines 414A-C, each illustrating $M_{ch}$ % as a function of charge rate ($r_{ch}$) for ESD 150 having different $r_{ch\_max}$ characteristics (charged over a range wherein 1/b=5 and α=1): plot line 416A illustrates $M_{ch}$ % as a function of $r_{ch}$ for the ESD 150 having an $r_{ch\_max}$ of $1*C_1$, plot line 416B shows $M_{ch}$ % as a function of $r_{ch}$ for the ESD 150 having an $r_{ch\_max}$ of $2*C_1$; and plot line 414C shows $M_{ch}$ % as a function of $r_{ch}$ for an ESD 150 having an $r_{ch\_max}$ of $5*C_1$.

The ESD manager 110 may be configured to maintain information pertaining to $M_{ch}$ % as a function of charge rate ($r_{ch}$) for respective ESD 150 in respective ESD profiles 142. The ESD manager 110 may be further configured to evaluate charge configurations 121 based on the $M_{ch}$ % characteristics of respective ESD 150. The ESD manager 110 may be configured to reject and/or modify charge configurations 121 that would result in $M_{ch}$ % quantities above determined CC thresholds 129, as disclosed herein (and may determine the $M_{ch}$ % quantities by use of respective $M_{ch}$ % plots and/or plot lines, as illustrated in FIGS. 4A through C).

Referring back to FIG. 1D, in some implementations, the ESD manager 110 is configured to acquire ESD data 133 pertaining to respective ESD 150. The ESD manager 110 may be configured to acquire ESD data 133 from the ESD 150, an ESD interface device, such as the charging device 130, and/or the like. Alternatively, or in addition, the ESD manager 110 may be configured to acquire ESD data 133 through an interface 126, as illustrated in FIG. 1C. The ESD data 133 may include any suitable information pertaining to an ESD 150, such as ESD-type characteristics, ESD-specific characteristics, an operation being performed on the ESD 150, ESD performance characteristics, and/or the like. The ESD data 133 acquired by the interface 126 may include, but is not limited to: an identifier of the ESD 150, a voltage or SoC of the ESD 150, an impedance of the ESD 150, a temperature of the ESD 150, the charge rate of a charge operation being performed on the ESD 150, the discharge rate of a discharge operation being performed on the ESD 150, an input voltage to the ESD 150, an output voltage of the ESD 150, and/or the like.

In some implementations, the ESD data 133 may include measurements pertaining to one or more ESD performance characteristics, such as ESD capacity, charge acceptance, charge retention, power delivery, internal impedance, ESD voltage, cell voltage, frequency of self-discharge, temperature rise during operation, temperature rise during charge operations (at specified charge rates), temperature rise during discharge operations (at specified discharge rates), and/or the like. The CRA modeler 122 may utilize the ESD data 133 to develop and/or refine charge configurations 121, charge conditions 124, CC metrics 128, and/or other age-related model(s) associated with the ESD 150. The CRA modeler 122 may be further configured to utilize the ESD data 133 to develop and/or refine ESD profiles 142 for respective ESD 150 (and/or develop aging models 125), as disclosed herein.

FIG. 5 illustrates an example of a system 100 for managing ESD 150 based, at least in part, on charge-related age models associated with the ESD 150. In the FIG. 5 example, the ESD manager 110 is configured to maintain profile data 140 comprising one or more ESD profiles 142. The ESD profiles 142 may comprise ESD-type characteristics of respective ESD 150, as disclosed herein. The ESD profiles 142 may be further configured to specify $M_{ch}$ and/or $M_{ch}$ % quantities for ESD 150 under specified charge conditions 124 (e.g., $M_{ch}$ tables, plots, and/or the like). In the FIG. 5 example, the ESD manager 110 may be further configured to acquire and/or maintain charge-related aging (CRA) profile data 144 for respective ESD 150 (and/or ESD types). The CRA profile data 144 may comprise ESD-specific information pertaining to charge-related aging behavior of specified ESD 150. The CRA profile data 144 may comprise information pertaining to an age of specified ESD 150 (e.g., a current age of a specified ESD 150). In some examples, the CRA profile data 144 may be configured to model temporal charge-related behavior of specified ESD 150.

As disclosed above, the ESD manager 110 may be configured to estimate a maximum extent of charge-related aging incurred by specified ESD 150 in response to specified charge conditions 124. The estimates may comprise CC metrics 128 for specified charge conditions 124, which may comprise and/or incorporate an $M_{ch}$ and/or $M_{ch}$ % quantity configured to quantify the maximum extent of aging (e.g., fraction or proportion) predicted to be incurred over time. The disclosed ESD manager 110 may be further configured to develop and/or maintain temporal, charge-related aging models (aging models 125) for specified ESD 150 and/or ESD types. The aging models 125 may be configured to model and/or predict temporal, charge-related aging of respective ESD 150 (and/or ESD types). The aging model 125 of an ESD 150 may quantify charge-related aging imposed on the ESD 150 by specified charge conditions 124. In some implementations, the aging model 125 may be further configured to model temporal, charge-related behavior of the ESD 150 under the specified charge conditions 124 over time (e.g., the rate at which ESD performance characteristics degrade under specified charge conditions 124). More specifically, the aging model 125 may be configured to model the rate at which the ESD 150 will reach a maximum extent of charge-related aging ($M_{ch}$), or maximum extent of ESD performance degradation, for specified charge conditions 124 over time. In the FIG. 5 example, the aging models 125 constructed by the ESD manager 110 (and/or CRA modeler 122) may be expressed and/or embodied, as follows:

$$\psi_{ch}(t) = M'_{ch} + 2(M_{ch} - M'_{ch})\left[\frac{1}{2} - \frac{1}{1 + \exp((p_{ch}t)^{q_{ch}})}\right] \quad \text{Eq. 17}$$

In Eq. 17, $\psi_{ch}(t)$ may be configured to model a charge-related aging trend of one or more ESD performance characteristics as a function of time (t). Eq. 17 may, therefore, be configured to model charge-related aging as a function of degradation of the designated ESD performance characteristics. The disclosed aging models 125 may be configured to model any suitable energy storage characteristic, including, but not limited to: energy storage capacity (e.g., model capacity loss, as disclosed herein), impedance (e.g., increases to internal impedance as a function of charge-related aging), discharge rate (e.g., decreases to maximum discharge rate and/or power output), charge acceptance, voltage degradation, frequency of self-discharge, and/or the like. The $\psi_{ch}(t)$ function may be configured to quantify degradation to designated ESD performance characteristics under specified conditions (e.g., capacity loss under a $C_1$ discharge rate and aging temperature of 30° C.).

The $M'_{ch}$ parameter of Eq. 17 may quantify the extent of charge-related aging due to charging at time zero, which may be substantially 0 for newly fabricated ESD 150. Alternatively, the $M'_{ch}$ parameter may quantify charge-related aging of a repurposed ESD 150. The Mph term may quantify the maximum extent of charge-related aging due to specified charge conditions 124, as disclosed herein. The $p_{ch}$ and $q_{cd}$, terms of Eq. 17 may model the rate at which charge-related aging occurs over time (e.g., the rate at which the ESD 150 reaches $M_{ch}$). In some examples, the $p_{ch}$ and $q_{ch}$ terms may model reaction rates of the ESD 150, which may correspond to the cell chemistry of the ESD 150. The $p_{ch}$ quantity may be an equivalent intrinsic rate constant for the charge-related aging mechanism, and the $q_{ch}$, term may be an equivalent intrinsic kinetic order of the charge-related aging mechanism. The $p_{ch}$ and/or $q_{cd}$, terms may indicate the sensitivity of the specified ESD 150 to stress factors defined by specified charge conditions 124 over time.

In some examples, the $p_{ch}$ and/or $q_{ch}$, terms may be determined by, inter alia, regression analysis of ESD aging data (e.g., through testing, experience, and/or analysis). The ESD aging data may be configured to model degradation of designated ESD performance characteristics under specified conditions (e.g., capacity loss under a $C_1$ discharge rate and aging temperature of 30° C.). The disclosed aging models 125 may provide an accurate mechanism for estimating temporal charge-related aging behavior of specified ESD 150 in response to subjecting the ESD 150 to specified charge conditions 124 over a specified timespan (e.g., a usage time). As used herein, a usage "time," "timeline," "timeframe," "timespan," and/or "duration" refers to a time during which an ESD 150 is used for energy storage operations. The ESD 150 may age during the usage timespan and, as such, a usage timespan may also be referred to as an age and/or aging timespan. The disclosed aging models 125 may be used to model charge-related aging of specified ESD 150 over specified usage timespans. The ESD manager 110 may manage charge operations in accordance with the aging models 125. The ESD manager 110 may determine charge configurations 121 for an ESD 150 to, inter alia, ensure that the ESD 150 will endure for at least a designated usage duration (e.g., ensure that the performance of the ESD 150 will not degrade beyond a threshold prior to the end of the designated usage duration).

Constructing an aging model 125 for an ESD 150 (or ESD type) may comprise acquiring one or more ESD aging (ESDA) datasets 161. As used herein, an ESDA dataset 161 refers to information pertaining to ESD aging characteristics, such as performance degradation, over time and/or under specified conditions. An ESDA dataset 161 may comprise measurements of ESD performance characteristics over time and/or under specified conditions (e.g., capacity measurements, power delivery measurements, internal impedance measurements, and/or the like). The measurements may indicate performance degradation and/or degradation over time under the specified conditions. The ESDA datasets 161 may include non-charge-related aging (NCRA) datasets 162, charge-related aging (CRA) datasets 164, and/or the like.

The NCRA datasets 162 may be configured to characterize ESD aging due to aging mechanisms other than charge-related aging mechanisms. The NCRA datasets 162 may comprise performance measurements acquired over timeframes during which ESD 150 were charged under charge conditions 124X configured to result in low or negligible charge-related aging (e.g., low charge rates, low SoC ranges, low $V_{start}$–$V_{ch}$ differentials, at appropriate temperatures, and/or the like, such that $M_{ch}$ is low or substantially 0). More specifically, the NCRA datasets 162 may include measurements of performance degradation observed in an ESD 150 charged under charge conditions 124 configured to produce charge-related performance degradation below a model threshold. Performance degradation observed in the NCRA datasets 162 may, therefore, indicate a fraction and/or percentage of performance degradation attributable to mechanisms other than charge-related aging mechanisms. The NCRA datasets 162 may further comprise ESD aging characteristics acquired under specified discharge conditions 424 (e.g., under a plurality of different discharge-conditions 424A-X, including baseline discharge conditions 424X configured to result in minimal and/or negligible discharge-related aging).

The CRA datasets 164 may be configured to characterize charge-related aging associated with specified charge conditions 124. The CRA datasets 164 may be comprise performance measurements acquired over time under specified charge conditions 124A-N. More specifically, the CRA datasets 164 may comprise measurements of performance degradation observed in ESD 150 charged under charge conditions 124 configured to produce charge-related performance degradation that exceeds a model threshold. The CRA datasets 164 may, therefore, indicate an extent and/or rate of performance degradation attributable to respective charge conditions 124A-N. In some examples, the CRA datasets 164 may be further configured to characterize ESD aging under specified discharge conditions 424. In some aspects, the discharge conditions 424 may be substantially the same and/or constant. Alternatively, the ESD manager 110 may be configured to acquire CRA datasets 164 under different combinations of charge conditions 124 and/or discharge conditions 424.

In some implementations, the ESD manager 110 may receive ESDA datasets 161 for one or more ESD 150 (and/or ESD types). The ESDA datasets 161 may be received through the communication interface 104 and/or HMI component(s) of the computing device 101. The ESD manager 110 may be configured to retrieve and/or maintain one or more ESDA datasets 161 within the non-transitory storage 106 of the computing device 101. Alternatively, or in addition, the ESD manager 110 may be configured to acquire one or more ESDA datasets 161 from, inter alia, an ESD interface device, such as the charging device 130. The ESD manager 110 may be configured to retrieve ESD data 133 pertaining to respective ESD 150, as disclosed herein. The ESD manager 110 may be further configured to derive one or more ESDA datasets 161 from the ESD data 133. As disclosed herein, the ESD data 133 may include measurements pertaining to ESD performance characteristics of an ESD 150, such as ESD capacity, charge acceptance, charge retention, power delivery, internal impedance, ESD voltage, cell voltage, frequency of self-discharge, temperature rise during operation, temperature rise during charge operations (at specified charge rates), temperature rise during discharge operations (at specified discharge rates), and/or the like. The CRA modeler 122 may utilize the ESD data 133 to monitor, quantify, track, and/or model ESD performance degradation.

The ESD manager 110 may acquire an NCRA dataset 162 for a particular ESD type by: a) subjecting a first ESD 150 of the particular ESD type to charge conditions 124 configured to produce charge-related performance degradation below a model threshold (e.g., charge conditions 124X), and b) acquiring ESD data 133 comprising measurements of one or more ESD performance characteristics of the first ESD 150 over time. Acquiring the NCRA dataset 162 may further including discharging the first ESD 150 under specified discharge conditions 424, as disclosed herein. The ESD manager 110 may acquire a CRA dataset 164 for the particular ESD type by: a) subjecting a second ESD 150 of the particular ESD type to charge conditions 124 configured to produce charge-related performance degradation above the model threshold (e.g., one or more of charge conditions 124A-N), and b) acquiring ESD data 133 comprising measurements of one or more ESD performance characteristics of the second ESD 150 over time. Acquiring the CRA dataset 164 may further including discharging the second ESD 150 under specified discharge conditions 424, as disclosed herein.

The ESD manager 110 may be configured to develop aging models 125 by use of the acquired ESDA datasets 161. Developing an aging model 125 for an ESD 150 may comprise determining $M_{ch}^{o}$, $p_{ch}$, and/or $q_{ch}$, terms of Eq. 17. As disclosed above, $M_{ch}^{o}$ may quantify the maximum extent of ESD aging that can be attributed to charge conditions 124. The $M_{ch}^{o}$ quantity may be expressed in terms of a fraction or percentage of total performance loss (e.g., may be between 0 to 100% of total performance loss, $M_{total}$); MA may indicate the percentage of total performance loss not attributable to other mechanisms (e.g., $M_{ch}^{o}=100-\Sigma_j M_j^{o}$, where $M_j^{o}$ is a percentage of performance loss attributable to a mechanism other than the charge-related aging mechanism). In the non-limiting example illustrated in FIG. 2, the maximum percentage of total performance degradation ($M_{total}$) attributable to non-charge-related mechanisms (e.g., baseline and/or discharge conditions 424) is 40% and, as such, the maximum percentage of total performance degradation ($M_{total}$) attributable to charge conditions 124 ($M_{ch}^{o}$) is 60%.

In the FIG. 5 example, the ESD manager 110 may be configured to determine $M_{ch}^{o}$ by use of the ESDA datasets 161 pertaining to the ESD 150. The ESD manager 110 determine total performance degradation ($M_{total}$) based on performance measurements of the ESDA datasets 161. As disclosed above, the NCRA datasets 162 may quantify performance degradation due to non-charge-related mechanisms (e.g., baseline and/or discharge-related mechanisms). The ESD manager 110 may, therefore, characterize the extent and/or rate of non-charge-related mechanisms based on performance degradation observed in the NCRA datasets 162. The CRA datasets 164 may be configured to quantify performance degradation under different charge conditions 124 (e.g., charge conditions 124A-N). Therefore, differences in the extent and/or rate of performance degradation between the NCRA datasets 162 and the CRA datasets 164 may be attributable to the charge-related aging mechanism (e.g., the differences may indicate the extent and/or rate of performance degradation attributable to the charge-related aging mechanism).

In some implementations, the ESD manager 110 is configured to determine a total extent of performance loss ($M_{total}$) of a specified energy storage characteristic (based on performance measurements of the ESDA datasets 161). The ESD manager 110 may be further configured to determine the fraction or percentage of $M_{total}$ attributable to non-charge-related aging mechanisms based on, inter alia, the NCRA datasets 162. The ESD manager 110 may determine the maximum percentage of performance loss attributable to discharge-related mechanisms (e.g., $M_{discharge}$ in FIG. 2) based on, inter alia, performance degradation observed under specified discharge conditions 424A-X, including baseline conditions 424X ($M_{baseline}$ in FIG. 2). The ESD manager 110 may determine the $M_{ch}^{o}$ quantity of the ESD 150 as $M_{ch}^{o}=100-M_{discharge}$. Alternatively, or in addition, developing the aging model 125 may comprise performing a regression analysis on the ESDA datasets 161 pertaining to the ESD 150. As disclosed above, the NCRA datasets 162 are configured to quantify performance degradation due to non-charge-related mechanisms (e.g., under baseline charge conditions 124X configured to exclude or minimize performance degradation due to charge-related aging). By contrast, the CRA datasets 164 are configured to model charge-related aging under non-baseline charge conditions 124A-N. The regression analysis may comprise characterizing differences between performance degradation observed in the CRA datasets 164 and performance degradation observed in the NCRA datasets 162, which differences may be attributable to charge-related aging (e.g., $M_{ch}^{o}$, pch and/or qch). The regression analysis may comprise distinguishing charge-related performance degradation from non-charge-related performance degradation (under respective sets of charge conditions 124A-N) based on differences in the extent and/or rate of performance degradation between the NCRA datasets 162 and CRA datasets 164. The regression analysis may comprise determining an $M_{ch}^{o}$ quantity based on the maximum extent of charge-related performance degradation observed over time (e.g., based on differences between the extent of performance degradation observed in the NCRA datasets 162 and the extent of performance degradation observed in the CRA datasets 164). The regression analysis may further comprise determining the $p_{ch}$ and/or $q_{ch}$, terms of Eq. 17, which may be configured to model the rate at which charge-related performance degradation occurs over time (e.g., model the rate at which chemical reactions of the charge-related aging mechanism occur under specified charge conditions 124). The CRA datasets 164 may determine $p_{ch}$ and/or $q_{ch}$ quantities associated with respective charge conditions 124A-N based on differences between performance degradation observed under the respective charge conditions 124A-N. In some implementations, the determining comprises fitting $p_{ch}$ and/or $q_{ch}$ of Eq. 17 to charge-related performance degradation determined for respective charge conditions 124A-N.

As disclosed above, the CRA datasets 164 may be configured to quantify the extent and/or rate of performance degradation under specified charge conditions 124 (e.g., charge conditions 124A-N). In some examples, different charge conditions 124 may result in substantially the same extent of charge-related aging ($M_{ch}$) but may differ with respect to the rate at which the performance degradation occurs (e.g., result in different $p_{ch}$ and/or $q_{ch}$, terms for $\psi_{ch}(t)$, as disclosed herein). By way of non-limiting example, an ESD 150 may reach maximum degradation ($M_{ch}$) twice as fast under a first set of charge conditions 124A than a second set of charge conditions 124B. The ESD manager 110 may be further configured to analyze differences in the rate at which performance degradation occurs under different charge conditions 124A-N in order to, inter alia, diagnose the impact of respective charge conditions 124 on $p_{ch}$ and/or $q_{ch}$. In particular, the ESD manager 110 may be configured to determine cause-and-effect relationships between respective charge conditions 124 charge-related aging rate (e.g., rates of $\psi_{ch}(t)$ over time). The ESD manager 110, therefore, may be configured to not only: a) identify charge conditions 124 that determine the maximum extent charge-related aging ($M_{ch}$), but also b) predict the rate at which ESD 150 will reach the determined $M_{ch}$ quantity over time, and/or c) determine the influence of respective charge conditions 124 on the predicted charge-related aging rate. The ESD manager 110 may use the disclosed aging models 125 to develop charge configurations 121 adapted to: a) control the maximum extent of charge-related aging imposed by charge operations (e.g., manage $M_{ch}$); and b) manage the rate at which ESD 150 are aged by the charge operations (e.g., control the rate at which performance of the ESD 150 are degraded by charge-related aging over time, which may comprise determining charge conditions 124 to reduce the $p_{ch}$ and/or $q_{ch}$, terms of $\psi_{ch}(t)$, as disclosed herein).

FIG. 6 is a plot 601 illustrating examples of aging models 125 determined by the ESD manager 110, as disclosed herein (e.g., aging models 125A-E determined in accordance with Eq. 17). The plot lines 612 represent respective aging models 125A-E, each configured to model charge-related aging behavior under different charge conditions 124A-E. The aging models 125A-E may be configured to model charge-related performance loss over time (e.g., degradation to specified ESD performance characteristics, such as ESD capacity, internal impedance, and/or the like). In FIG. 6, the charge-related aging behavior, $\psi_{ch}(t)$, is expressed as a percentage of performance loss from 0% (full, rated performance) to a maximum charge-related aging extent $M_{ch}$ %. The charge conditions 124A-E may be configured to result in substantially the same maximum extent of charge-related aging ($M_{ch}$ % of about 20% over an aging timeline of about 250 weeks). The aging models 125A-E may illustrate differences in rate at which ESD 150 reach substantially the same $M_{ch}$ % under the different charge conditions 124A-E. In FIG. 6: the aging model 125A shows charge-related ESD aging under charge conditions 124A resulting in $p_{ch}$=0.10 and $q_{ch}$=1.0; the aging model 125B shows charge-related ESD aging under charge conditions 124B resulting in $p_{ch}$=0.03 and $q_{ch}$=2.0; aging model 125C shows charge-related ESD aging under charge conditions 124C resulting in which $p_{ch}$=0.03 and $q_{ch}$=1.0; the aging model 125D shows charge-related ESD aging under charge conditions 124D resulting in $p_{ch}$=0.03 and $q_{ch}$=0.5; and the aging model 125E shows charge-related ESD aging under charge conditions 124E resulting in $p_{ch}$=0.01 and $q_{ch}$=1.0.

As shown by the aging models 125A-E illustrated in FIG. 6, different charge conditions 124A-E producing substantially the same maximum extent of charge-related aging ($M_{ch}$) may age ESD 150 at significantly different rates. The rate at which different charge conditions 124A-E age ESD 150 may be modeled by, inter alia, the $p_{ch}$ and/or $q_{ch}$ terms of the aging models 125A-E. As disclosed above, the $p_{ch}$ and/or $q_{ch}$, terms may be configured to model the rate of ESD charge-related aging mechanisms (e.g., model chemical reaction rates involved in charge-related aging of electrochemical ESD 150, such as lithium ion ESD 150). As disclosed above, the ESD manager 110 may utilize the disclosed aging models 125 to diagnose specific causes of charge-related aging (e.g., determine the influence of respective charge conditions 124 on aging rates). In the FIG. 6 example, the ESD manager 110 may compare $\psi_{ch}(t)$ determined for respective charge conditions 124A-E (and/or the $p_{ch}/q_{ch}$ terms thereof) and determine the influence of particular charge conditions 124 based on the comparing. By way of non-limiting example, the ESD manager 110 may determine that: a) the charge conditions 124A correspond to higher SoC than other charge conditions 124B-E (e.g., higher $V_{ch}$ levels), and that b) the charge rate of charge conditions 124E correspond to same or similar charge rates ($r_{ch}$) as other charge conditions 124A-D. In response, the ESD manager 110 may determine that the charge-related aging mechanism of the ESD 150 is relatively sensitive to SoC and is less sensitive to charge rate. In some implementations, the ESD manager 110 is configured to determine charge conditions sensitivity (CCS) data 525 for respective ESD 150, the CCS data 525 quantifying the sensitivity of respective ESD 150 to specified charge conditions 124 (e.g., sensitivity to SoC, charge rate, temperature, and so on, which may correspond to the cell chemistry of the ESD 150, cell materials, and/or the like). The CCS data 525 may quantify the effect of specified charge conditions to charge-related degradation rates (e.g., the rate at which the ESD 150 degrades due to charge conditions 124 over time). In the FIG. 6 example, the CCS data 525 determined for the ESD 150 may indicate that the ESD 150 has higher sensitivity to SoC (high sensitivity to $V_{ch}$) and lower sensitivity to charge rate ($r_{ch}$) (e.g., ESD $\psi_{ch}(t)$ rate is more sensitive to $V_{ch}$ than $r_{ch}$). The CCS data 525 determined for respective ESD 150 may be maintained in CRA profile data 144 (and/or ESD profiles 142) of the respective ESD 150, as disclosed herein.

The ESD manager 110 may be configured to select ESD 150 for use in particular energy storage applications based on, inter alia, aging models 125 and/or CCS data 525 determined for the ESD 150, as disclosed herein. An energy storage application may specify conditions under which the ESD 150 will be charged. By way of non-limiting example, a first energy storage application (ESA) may require that ESD 150 be maintained at a high SoC, which may require charge operations to charge the ESD 150 to high $V_{ch}$ levels (at relatively low charge rates). Using the ESD 150 of the FIG. 6 example in the first ESA may, therefore, result in a higher charge-related aging rate due to, inter alia, the relatively high sensitivity of the ESD 150 to SoC. The ESD manager 110 may use the CCS data 525 to select a more suitable ESD 150 for the first ESA, which may comprise selecting an ESD 150 having lower sensitivity to $V_{ch}$ (and/or higher sensitivity to charge rate). By way of further non-limiting example, the ESD manager 110 may select an ESD 150 for use in a second ESA, which may involve charging ESD 150 at relatively high rates prior to use (and maintaining the ESD 150 at lower SoC otherwise). Using the ESD 150 selected for the first ESA in the second ESA may result in a higher charge-related aging rate (e.g., due to higher sensitivity of the ESD 150 to charge rate). The ESD manager 110 may utilize the CCS data 525 to select a suitable ESD 150 for the second ESA, which may comprise selecting the ESD 150 of the FIG. 6 example due to, inter alia, lower sensitivity of the ESD 150 to higher charge rates. Although particular examples of CC data 524 and/or ESA are described herein, the disclosure is not limited in this regard and could be adapted to select ESD 150 for particular ESA based on any suitable criteria, sensitivity, and/or the like.

As disclosed above, the ESD manager 110 may use the aging models 125A-E to determine charge configurations 121 adapted to: a) produce a specified maximum extent of charge-related aging ($M_{ch}$); and b) arrive at the specified maximum extent ($M_{ch}$) after a designated time. The ESD manager 110 may leverage the aging models 125A-E to determine charge configurations 121 capable of satisfying specified usage guarantees 613. A usage guarantee 613 may specify that performance of a specified ESD performance characteristic will not degrade by more than a threshold during a usage timespan 615. In one example, the ESD manager 110 may be configured to satisfy a first usage guarantee 613A, which may specify that performance degradation will not reach 20% on or before the end of the usage timespan 615A (e.g., week 208). The ESD manager 110 may determine first charge configuration(s) 121 to satisfy the first usage guarantee 613A, the first charge configuration(s) 121 corresponding to aging models 125D and/or 125E in which $M_{ch}$ % is predicted to remain above 20% beyond week 208 (e.g., first charge configuration(s) 121 having charge conditions 124D and/or 124E). In another example, the ESD manager 110 may be configured to satisfy a second usage condition 613B that only requires performance to remain above 20% for a usage timespan 615B of 18 months (78 weeks). The ESD manager 110 may determine second charge configuration(s) 121 corresponding to charge conditions 124B of aging model 125B, which may provide faster charge times while guaranteeing a useful life of the specified usage timespan 615B (at least 18 months).

Referring back to FIG. 5, the conditions under which ESD 150 are charged (charge conditions 124) may depend on the ESA in which the ESD 150 are used. Moreover, the ESA and/or charge conditions 124 may change over time. Charge conditions 124 may change due to a number of different factors including, but not limited to: environmental conditions (e.g., ambient temperature), operational factors (e.g., usage of the ESD 150), and so on. Changes to charge conditions 124 may result in corresponding changes to CC metrics 128 (e.g., different $M_{ch}$ and/or $M_{ch}$ % quantities), different charge-related aging rates (e.g., different $p_{ch}$, and/or $q_{ch}$ terms for $\psi_{ch}(o)$ and/or the like. The ESD manager 110 may be further configured to develop aging models 125 configured to model charge-related aging under changing charge conditions 124 (as opposed to substantially constant charge conditions 124). As illustrated in FIG. 7A, the ESD manager 110 may be configured to segment an age timeline into a plurality of usage periods 715, each having distinct charge conditions 124 (e.g., z usage periods, each having respective charge conditions 124). The ESD manager 110 may be further configured to develop an aging model 125 configured to model charge-related aging during each of the z usage periods 715, as follows:

$$\psi_{ch}(t) = \sum_{k=1}^{z} M'_{ch} + 2(M_{ch\_k} - M'_{ch})\left[\frac{1}{2} - \frac{1}{1 + \exp((p_{ch}t)^{q_{ch}})}\right]_k \quad \text{Eq. 18}$$

In Eq. 18, each kth usage period 715 may correspond to respective charge conditions 124, resulting in respective charge-related age modeling terms, such as a respective $M_{ch\_k}$ for charge operations performed during the kth usage period, and corresponding charge-related aging rate terms $p_{ch}$ and/or $q_{ch}$ as disclosed herein. An aging model 125 configured to cover multiple different usage periods 715 may be referred to as a "multi-region" or "multi-period" aging model 125. The aging model 125 per Eq. 18 may, therefore, determine a cumulative performance loss (or performance degradation) incurred by the ESD 150 over the z usage periods 715.

The ESD manager 110 may be configured to develop and/or maintain multi-period aging models 125 in profile data 140 and/or respective CRA profile data 144 (e.g., CRA profile data 144 for specified ESD 150, ESD types, and/or the like). The ESD manager 110 may be further configured to utilize the disclosed multi-period aging models 125 to, inter alia, manage charge operations on specified ESD 150, as disclosed herein. In particular, the ESD manager 110 may utilize multi-period aging models 125 to control charge operations performed on an ESD 150 at different times during the life of the ESD 150.

FIG. 7A is a plot illustrating further examples of multi-period aging models 125, as disclosed herein. The aging model 125 of FIG. 7A may be configured to model charge-related aging as a percentage of performance loss of designated ESD performance characteristics over time (between 0% and an upper bound of about 30%). The multi-period aging model 125 illustrated by plot line 712 may be configured to model charge-related aging behavior of an ESD 150 (and/or ESD 150 of a particular type) during each of a plurality of usage periods 715A-D, each having different respective charge conditions 124. The multi-period aging model 125 may be determined in accordance with Eq. 18.

In the FIG. 7A example, the usage period 715A may correspond to charge conditions 124 resulting in $p_{ch}=0.01$, $q_{ch}=1.0$, and $M^0=0.2$ (from about week 0 to about week 52); the usage period 715B may correspond to charge conditions 124 resulting in $p_{ch}=0.03$, $q_{ch}=1.0$, and $M^0=0.2$ (from week 53 to about week 100); the usage period 715C may correspond to charge conditions 124H resulting in $p_{ch}=0.07$, $q_{ch}=1.0$, and $M^0=0.3$ (from week 101 to about week 125); and the usage period 715D may correspond to charge conditions 124 resulting in $p_{ch}=0.03$, $q_{ch}=1.0$, and $M^0=0.3$.

The ESD manager 110 may use the multi-period aging model 125 to manage charge operations during the age timeline. The ESD manager 110 may identify periods (and/or corresponding charge conditions 124) resulting in high levels of charge-related performance loss (e.g., usage period 715C). High levels of charge-related performance loss (rapid charge-related aging) may result in shortened useful life, or even failure if allowed to continue during the aging timeline. The ESD manager 110 may use the disclosed multi-region aging models 125 to detect and/or mitigate the effects of adverse charging conditions 124. In the FIG. 7A example, the ESD manager 110 may detect that usage period 715C produces unacceptably high levels of charge-related performance loss and, in response, modify the charge conditions 124H to be implemented during the usage period 715C. By way of non-limiting example, the usage period 715C may correspond to cold temperatures, which may increase charge-related aging of the ESD 150 (per the cell chemistry of the ESD 150 as quantified by the a parameter of Eq. 6, as disclosed herein). In response, the ESD manager 110 may reduce charge rates and/or target charge levels for charge operations performed during the usage period 715C in order to, inter alia, reduce charge-related aging and/or aging rate during the usage period 715C. Detecting the high levels of performance loss may comprise evaluating CC metrics 128 (e.g., $M_{ch}$) for charge conditions 124 during each usage period 715. The detecting may further comprise evaluating the rate of change of $\psi_{ch}(t)$ ($M_{ch}$ %) during respective usage periods 715. The ESD manager 110 may evaluate a derivative and/or second order derivative of the multi-region aging model 125 (and/or continuous approximation thereof). Alternatively, or in addition, the ESD manager 110 may be configured to evaluate derivatives during respective usage periods 715A-D (the aging model 125 being continuous within respective usage regions 715A-D).

Figure 7B:
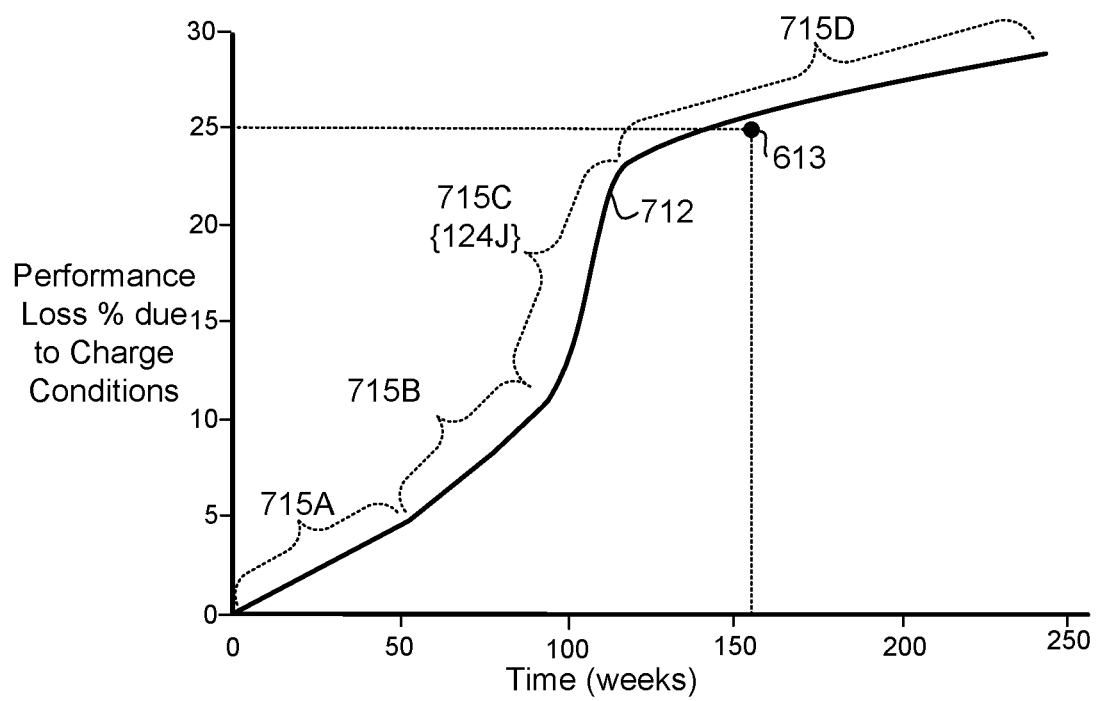
FIG. 7B illustrates another example of an aging model comprising a plurality of usage periods.

The ESD manager 110 may be further configured to manage charge operations to satisfy a usage guarantee 613. In the FIG. 7A example, the ESD manager 110 may determine that the charge conditions 124 during periods 715A-D may fail to satisfy a usage guarantee 613 that performance degradation remain below 25% for at least 3 years (156 weeks). In response, the ESD manager 110 may determine modified charge configuration(s) 121 for one or more of the usage periods 715A-D, the modified charge configuration(s) 121 enabling the ESD 150 to satisfy the usage guarantee 613. In the FIG. 7B example, the ESD manager 110 may determine charge conditions 124J for charge operations implemented during usage period 715C, which may be configured to reduce the extent and/or rate of charge-related aging, and thereby enable the ESD 150 to satisfy the usage guarantee 613. Determining the charge conditions 124J may comprise modifying the charge conditions 124H, as disclosed above (reduce charge rate, SoC range, convert a single-step charge operation into a multi-step charge operation, modify one or more steps of a multi-step charge operation, and/or the like).

As disclosed herein, the ESD manager 110 may utilize the CRA modeler 122 to manage energy storage operations, which may comprise: quantifying charge-related aging separately from other aging mechanisms (e.g., determine an maximum extent of charge-related aging $M_{ch}$ separate from other age-related mechanisms, such as discharge-related aging); determining CC metrics 128 for specified charge conditions 124 (e.g., determining the maximum extent of charge-related aging ($M_{ch}$) due to specified charge conditions 124), evaluating and/or modifying charge configurations 121 in accordance with the determined CC metrics 128; developing charge configurations 121 to satisfy CC thresholds 129 (e.g., determine charge configurations 121 that satisfy nominal and/or moderate $M_{ch}$ thresholds); diagnosing causes of charge-related aging (e.g., determining cause-and-effect relationships between charge conditions 124 and charge-related aging); modeling charge-related aging over time (e.g., developing aging models 125 to predict performance degradation incurred by the ESD 150 under specified charge conditions 124 over time); determining charge configurations 121 to satisfy usage guarantees 613 (e.g., determine charge conditions 124 to guarantee a specified performance level for a specified period of time); diagnosing causes of different charge-relate aging rates (e.g., cause-and-effect relationships between specified charge conditions 124 and charge-related aging rates); modeling charge-related aging under different conditions over time (e.g., developing multi-period aging models 125, as disclosed herein); determining charge configurations 121 for respective usage periods 715 (e.g., charge configurations 121 to manage charge-related aging during different usage periods 715 within the age timeline); and so on. The ESD manager 110 may utilize the disclosed CRA modeler 122 to manage ESD 150 and, in particular, configure charge operations to: manage charge-related aging and/or charge-related aging rates, avoid unsafe conditions, and so on. The ESD manager 110 may be configured to determine CC metrics 128 for single-step charge operations, multi-step charge operations, multi-step charge operations comprising one or more rest periods, and/or the like. The ESD manager 110 may be further configured to evaluate and/or modify charge configurations 121 based on CC metrics 128 determined for the charge configurations 121. The ESD manager 110 may be configured to modify a charge configuration 121 in order to, inter alia, reduce charge-related aging imposed thereby. The modifying may comprise converting a single-step charge operation into a multi-step charge operation, modifying one or more steps of a multi-step charge operation, and/or the like. The ESD manager 110 may be further configured to model temporal characteristics of charge-related ESD aging, which may comprise developing aging models 125 for specified ESD 150, as disclosed herein. Developing the aging models 125 may comprise acquiring ESD aging data for respective ESD 150 (or ESD types), the ESD aging data comprising a baseline ESD aging dataset (NCRA dataset 162) configured to characterize non-charge-related ESD aging characteristics and one or more charge-related ESD aging datasets (CRA datasets 164), each comprising ESD aging data corresponding to a respective set of charge conditions 124 (and/or respective charge configurations 121). Developing the aging models 125 may further comprise analyzing the ESD aging data. The CRA modeler 122 may be configured to perform regression analysis on ESD aging data for respective ESD 150, the regression analysis configured to determine $M_{ch}^{\circ}$, $p_{ch}$ and/or $q_{ch}$, quantities for respective ESD 150 and/or charge conditions 124. The aging models 125 may be configured to model charge-related performance degradation over a useful life of an ESD 150 (under substantially same and/or similar charge conditions 124). Alternatively, or in addition, the ESD manager 110 may develop aging models 125 configured to model charge-related performance degradation during each of a plurality of respective usage periods 715, each usage period 715 characterized by respective charge conditions 124 (e.g., multi-period aging models 125). The ESD manager 110 may utilize the disclosed aging models 125 to determine charge configurations 121 capable of satisfying one or more usage guarantees 613, determine cause-and-effect relationships between specific charge conditions 124 and the rate of charge-related aging on specified ESD 150 (e.g., quantify the sensitivity of respective ESD 150 to respective charge conditions 124), and so on. The ESD manager 110 may be further configured to select ESD 150 for particular ESA based on aging models 125 and/or CCS data 525 determined for respective ESD 150.

The ESD manager 110 may be further configured to incorporate the disclosed CC metrics 128 and/or aging models 125 metrics and/or models into other, multi-mechanism aging models. FIG. 8 illustrates an example of a system 100 for managing energy storage device based, at least in part, on multi-mechanism age modeling. In the FIG. 8 example, the ESD manager 110 is configured to maintain profile data 140, as disclosed herein (e.g., maintain ESD profiles 142 comprising information pertaining to specified types of ESD 150, CRA profile data 144 comprising information pertaining to charge-related aging behavior of specified ESD 150, such as aging models 125, and so on). The ESD manager 110 may be further configured to manage charge operations in accordance with CC metrics 128 and/or aging models 125 determined for respective ESD 150 under respective charge conditions 124, as disclosed herein.

The aging models 125 developed by the CRA modeler 122 may further include composite temporal aging models 825 for respective ESD 150, ESD types, and/or the like. The composite temporal aging models 825 may be configured to model ESD aging corresponding to a number of aging mechanisms, as follows:

$$\psi_{total}(t) = \psi_{ch}(t) + \sum_{k=1}^{n} \psi_{discharge}(t) \qquad \text{Eq. 19}$$

$$\psi_{total}(t) = \sum_{j=1}^{m} \left\{ M'_j + 2(M_j - M'_j) \left[ \frac{1}{2} - \frac{1}{1 + \exp((p_j t)^{q_j})} \right] \right\} \qquad \text{Eq. 20}$$

The $\psi_{total}(t)$ function defined by Eqs. 19 and/or 20 may be configured to quantify ESD aging as a function of degradation of specified ESD performance characteristics, as disclosed above (e.g., degraded energy storage capacity, increased impedance, and/or the like). The $\psi_{total}(t)$ function may be configured to quantify degradation to designated ESD performance characteristics under specified standard conditions (e.g., capacity loss under a $C_1$ discharge rate and aging temperature of 30° C.). The $\psi_{total}(t)$ function may quantify a total and/or composite of charge-related aging mechanisms and one or more other aging mechanisms (e.g., each of n discharge-related aging mechanisms $\psi_{discharge}(t)$, as illustrated in Eq. 19). In Eq. 19, the charge-related aging may be modeled as disclosed above (e.g., by $\psi_{ch}(t)$ determined in accordance with Eq. 17 and/or Eq. 18). Eq. 20 may be configured to quantify aging behavior of j aging mechanisms, the j aging mechanisms including charge-related aging mechanisms (e.g., charge conditions 124) and discharge-related aging mechanisms (discharge conditions). The charge-related aging mechanisms may be modeled in accordance with Eq. 17 and/or 18, as disclosed above. The ESD manager 110 may utilize the disclosed composite temporal aging models 825 to manage charge and/or discharge of specified ESD 150. The ESD manager 110 may determine charge conditions 124 and/or discharge conditions to ensure that performance degradation does not exceed a threshold within a determined timeframe. The ESD manager 110 may determine charge conditions 124 to ensure that a composite degradation, including degradation due to discharge-related aging mechanisms, does not exceed the threshold within the determined timeframe. The ESD manager 110 may, therefore, determine charge conditions 124 over the usage timeline (and/or charge conditions for particular usage periods) based on, inter alia, discharge-related aging over the usage timeline. The ESD manager 110 may charge conditions 124 and/or discharge conditions such that a sum of aging due charge-related aging mechanisms and discharge-related aging mechanisms remains below a threshold for a determined time period. The ESD manager 110 may, therefore, determine charge conditions 124 in accordance with predetermined discharge conditions and/or may determine discharge conditions in accordance with predetermined charge conditions 124.

In some implementations, the ESD manager 110 may be configured to acquire ESD data 133 pertaining to respective ESD 150 (and/or ESD 150 of respective ESD types). The ESD data 133 may include information pertaining to ESD performance characteristics, such as ESD capacity, charge acceptance, charge retention, power delivery, internal impedance, ESD voltage, cell voltage, frequency of self-discharge, temperature rise during operation, temperature rise during charge operations (at specified charge rates), temperature rise during discharge operations (at specified discharge rates), and/or the like. The ESD manager 110 may utilize the ESD data 133 pertaining to respective ESD 150 (and/or ESD types) to develop and/or refine profile data 140, aging models 125, and/or composite temporal aging models 825 for the respective ESD 150 (and/or ESD types).

FIG. 9 illustrates a flow diagram of a first example of a method 900 for managing ESD 150. The operations or steps of method 900 and/or the other methods disclosed herein may be embodied and/or implemented by any suitable means including, but not limited to: the ESD manager 110, hardware components, such as a computing device (e.g., computing device 101), computing resources (e.g., a processor 102, memory 103, communication interface 104, HMI components 105, non-transitory storage 106, and/or the like). Alternatively, portions of the method 900 and/or other methods disclosed herein may be embodied and/or implemented by computer-readable code, executable code, one or more libraries, computer-readable instructions stored on a non-transitory storage medium (e.g., non-transitory storage 106) configured to cause a computing device (e.g., computing device 101) and/or processor (e.g., processor 102) to implement the disclosed functionality, and/or the like.

At 910, an ESD manager 110 may be configured to determine a charge-related aging cost for a charge operation to be performed on a specified ESD 150. The ESD manager 110 may determine a CC metric 128 for a charge configuration 121 of the charge operation. Determining the CC metric 128 may comprise determining an $M_{ch}$ value configured to quantify a maximum extent or fraction of charge-related aging to result from subjecting the specified ESD 150 to the charge operation, as disclosed herein. The ESD manager 110 may determine the CC metric 128 by use of an age modeling engine 120. The age modeling engine 120 may be configured to identify and/or model charge conditions 124 that affect charge-related aging mechanism(s) of the ESD 150, as disclosed herein. The ESD manager 110 may determine the $M_{ch}$ quantity in accordance with charge conditions 124 of the specified charge operation (e.g., charge conditions 124 of the corresponding charge configuration 121 and/or charge configuration 121). In some implementations, the ESD manager 110 determines charge-related aging ($M_{ch}$) for a single-step charge operation. Alternatively, or in addition, the ESD manager 110 may be configured to determine charge-related aging ($M_{ch}$) for a multi-step charge operation, each step performed under respective charge conditions 124 (e.g., per corresponding step configurations 221) and/or having respective rest-periods therebetween (e.g., per corresponding rest-period configurations 223).

At 920, the ESD manager 110 may determine whether to modify the charge operation. The ESD manager 110 may be configured to evaluate the CC metric 128 (e.g., $M_{ch}$ quantity) determined for the charge operation at 910. The ESD manager 110 may be configured to compare the CC metric 128 to one or more CC thresholds 129, as disclosed herein. The ESD manager 110 may determine to modify the charge operation in response to the CC metric 128 exceeding one or more CC thresholds 129 (e.g., the determined $M_{ch}$ quantity exceeding a nominal and/or moderate $M_{ch}$ quantity). Alternatively, or in addition, the ESD manager 110 may determine to modify the charge operation in response to the CC metric 128 exceeding high, unacceptable and/or dangerous $M_{ch}$ quantities, as disclosed herein. In response to determining to modify the charge operation at 920, the flow may continue at 930; otherwise, the flow may continue at 940.

At 930, the ESD manager 110 may modify the charge operation. The ESD manager 110 may determine modification(s) to the charge operation that result in reductions to the CC metric 128 (e.g., reduce the maximum extent of charge-related aging $M_{ch}$). The modifications may be implemented in the charge configuration 121 and/or the like. Modifying the charge operation may comprise one or more of: reducing a charge rate of the charge operation, reducing a target voltage of the charge operation (e.g., reducing $V_{ch}$), reducing a SoC of the charge operation, increasing a temperature of the charge operation, and/or the like. In some examples, the ESD manager 110 may be configured to convert a single step charge operation into a multi-step charge operation at 930, as disclosed herein. Alternatively, or in addition, the ESD manager 110 may be configured to modify one or more steps of a multi-step charge operation (e.g., may include modifying the charge rate, target and/or interim voltage of one or more steps, and/or the like). In some aspects, the ESD manager 110 may be further configured to modify rest-period conditions of one or more steps of the multi-step charge operation to reduce charge-related aging incurred during rest periods, as disclosed herein.

At 940, the ESD manager 110 may be configured to implement the charge operation. The ESD manager 110 may implement the charge operation as modified at 930. Alternatively, the ESD manager 110 may implement the charge operation as defined at 910. Implementing the charge operation may comprise configuring a charge module or charging device 130 to perform the charge operation. The ESD manager 110 may configure the charging device 130 to implement the charge operation per the charge configuration 121 determined at 910 (and/or as modified at 930).

FIG. 10 illustrates a flow diagram of a second example of a method 1000 for managing ESD 150. At 1010, the ESD manager 110 is configured to retrieve and/or develop one or more aging model(s) 125 for an ESD 150 and/or ESD type (e.g., a battery, battery type, cell, cell type, and/or the like). The ESD manager 110 may be configured to develop aging models 125 configured to predict performance loss incurred by the ESD 150 over time. The aging model 125 may comprise a temporal, charge-related aging model 125, as disclosed herein.

Developing the aging models 125 may comprise determining charge conditions 124 that correlate with charge-related aging of the ESD 150 (or ESD type), as disclosed herein. Developing the aging models 125 at 1010 may comprise obtaining ESD aging data for the ESD 150 (and/or particular ESD type), the ESD aging data comprising one or more baseline ESD aging datasets (NCRA datasets 162) configured to characterize non-charge-related aging characteristics of the ESD 150, and one or more charge-related ESD aging datasets (CRA datasets 164), each comprising ESD aging data corresponding to a respective charge configuration 121 (or set of charge conditions 124). The CRA datasets 164 may be configured to characterize total aging of the ESD 150, including charge-related aging over time.

Developing the aging models 125 at 1010 may further comprise analyzing the ESD aging data. The developing may include performing regression analysis to determine $M_{ch}^o$, $p_{ch}$ and/or $q_{ch}$ quantities for respective ESD 150 under respective charge conditions 124, as disclosed herein. The regression analysis may comprise determining the equivalent intrinsic rate constant (e.g., $p_{ch}$) and/or the equivalent intrinsic kinetic order (e.g., $q_{ch}$) of the charge-related aging mechanisms of respective ESD 150 under respective charge conditions 124.

In some examples, the ESD manager 110 is configured to retrieve and/or develop a plurality of aging models 125 for respective ESD 150, each aging model 125 configured to model charge-related performance degradation over a useful life of the ESD 150 under a specified charge configuration 121 (and/or specified charge conditions 124). The charge-related performance degradation may be modeled in accordance with Eq. 17. Alternatively, or in addition, the ESD manager 110 may be configured to retrieve and/or develop multi-period aging models 125 for respective ESD 150, the multi-period aging models 125 configured to model charge-related performance degradation during each of a plurality of usage periods 715, each usage period 715 characterized by respective charge conditions 124 (and/or a respective charge configuration 121). The charge-related performance degradation may be determined in accordance with Eq. 18. In some examples, the ESD manager 110 is further configured to determine CCS data 525 for respective ESD 150, the CCS data 525 of an ESD 150 configured to indicate a sensitivity of the charge-related aging mechanism of the ESD 150 to specified charge conditions 124. The CCS data 525 may indicate the relative influence of specified charge conditions 124 on the rate at which ESD performance degrades to a maximum extent (e.g., rate at which charge-related degradation goes to Mph as a function of time).

At 1020, the ESD manager 110 may be configured to utilize the aging model(s) 125 to determine one or more charge configuration(s) 121 for charge operations to be performed on the ESD 150. The ESD manager 110 may determine charge configurations 121 for charge operations implemented on the ESD 150 by the charging device 130 (and/or other charging mechanism). In some aspects, the ESD manager 110 is configured to determine charge configurations 121 for single-step charge operations at 1020. Alternatively, or in addition, the ESD manager 110 may be configured to determine charge configurations 121 for multi-step charge operations at 1030 (e.g., may determine charge configurations 121 comprising a plurality of step configurations 221, each specifying charge conditions 124 for a respective step of the multi-step charge operation).

The charge configurations 121 determined at 1020 may correspond to respective charge conditions 124, the charge conditions 124 selected to ensure that performance loss due to charge-related aging remains below a threshold for a specified time period. The ESD manager 110 may be configured to determine charge configuration(s) 121 to satisfy a usage guarantee 613. More specifically, at 1020, the ESD manager 110 may determine a charge configuration 121 having charge conditions 124 in which performance loss remains below a threshold specified by the usage guarantee 613 for the specified timespan of the usage guarantee 613 (per one or more of the aging model(s) 125).

The ESD manager 110 may be configured to determine the charge configuration(s) 121 by use of an aging model 125 corresponding to a single set of charge conditions 124, which may be implemented over a specified time period. Alternatively, the ESD manager 110 may select a multi-period aging model 125 that specifies respective sets of charge conditions 124 during respective usage periods 715 defined within the specified time period. In some implementations, the ESD manager 110 may be further configured to evaluate and/or modify the selected charge conditions 124 such that the cumulative performance loss incurred by the ESD 150 remains below a threshold, as disclosed herein.

At 1030, the ESD manager 110 may be configured to manage charge operations performed on the ESD 150 in accordance with the charge configuration(s) 121 determined at 1020. The ESD manager 110 may be configured to generate charge instructions 131 corresponding to the charge configuration(s) 121. The charge instructions 131 generated for a charge configuration 121 may be configured to cause a charging device 130 (or other charging mechanism) to implement the charge operation specified by the charge configuration 121, as disclosed herein.

FIG. 11 illustrates a flow diagram of a third example of a method 1100 for managing ESD 150. At 1110, the ESD manager 110 may be configured to retrieve and/or develop an aging model 125 for an ESD 150. The aging model 125 may be configured to model performance degradation imposed on the ESD 150 over a usage interval (e.g., a usage timespan 615). The aging model 125 may be further configured to model performance degradation during each of a plurality of usage periods 715 (e.g., per Eq. 18). The aging model 125 may comprise one or more temporal aging model(s) 125 and/or temporal, multi-period aging models 125, as disclosed herein. In some implementations, the ESD manager 110 may be configured to develop the one or more aging models 125 for the ESD 150 (and/or ESD type), as disclosed herein.

At 1120, the ESD manager 110 may be configured to determine charge configurations 121 for the ESD 150 over the usage interval (or usage timespan 615). The charge configurations 121 may be determined in accordance with application-defined energy storage requirements. As disclosed above, the usage interval (or usage timespan 615) may comprise a plurality of distinct temporal regions (e.g., usage periods 715A-N). The usage periods 715A-N may be associated with respective application-defined energy storage requirements, such as a maximum charge time requirement, a minimum charge level requirement, and/or the like. The application-defined energy storage requirements may relate to conditions under which the ESD 150 is charged (respective charge conditions 124). At 1120, the ESD manager 110 may determine charge configurations 121 for respective usage periods 715, each charge configuration 121 adapted to satisfy the application-defined energy storage requirements of the corresponding usage period 715. The ESD manager 110 may determine a plurality of charge configurations 121A-N, each adapted to control charge operations performed during a respective one of the usage periods 715A-N (in accordance with application-defined energy storage requirements associated with the usage periods 715A-N). Therefore, at 1120, charge conditions 124A-N under which the ESD 150 is to be charged during respective usage periods 715A-N.

At 1130, charge-related aging of the ESD 150 may be evaluated over the usage interval. The evaluation may be based, at least in part, on the temporal, multi-period aging model 125 retrieved and/or developed at 1110. At 1130, the ESD manager 110 may be configured to evaluate multi-period aging model 125 per the charge configurations determined at 1120. The ESD manager 110 may be configured to model temporal charge-related performance degradation during respective usage periods 715A-N in accordance with the charge conditions 124A-N determined for the respective usage periods 715A-N (e.g., per Eq. 18). At 1130, the ESD manager 110 may construct a piecewise temporal model, as illustrated in the example plot 702 of FIG. 7B. The piecewise temporal model may include a plurality of segments, each corresponding to a respective usage period 715 and charge configuration 121. At 1130, the ESD manager 110 may be further configured to estimate a % of performance loss incurred during each usage period 715 and/or a cumulative % of performance loss incurred over the plurality of usage periods 715A-N (per the aging model(s) 125 developed and/or retrieved at 1110).

In some implementations, at 1130 the ESD manager 110 is further configured to determine whether to modify one or more of the charge configurations 121 determined at 1120. The determination may be based on the estimated extent and/or rate of charge-related aging predicted to the imposed on the ESD 150 per the aging model(s) 125. The determination may be based on whether performance degradation of the ESD 150 is predicted to exceed one or more thresholds within the usage interval (or usage timespan 615). The thresholds be based on, inter alia, the application-defined energy storage requirements (e.g., the application-defined energy storage requirements may specify that capacity of the ESD 150 not fall below a designated level). The ESD manager 110 may be configured to modify charge conditions 124A-N during one or more of the usage periods 715A-N in order to, inter alia, reduce the extent and/or rate of charge-related performance degradation. In some examples, the ESD manager 110 is configured to identify a usage period 715 associated with a high extent and/or rate of performance degradation at 1130. The ESD manager 110 may be further configured to modify charge conditions 124 associated with the identified usage period 715 to, inter alia, reduce the extent and/or rate of performance degradation, as disclosed herein.

At 1140, the ESD manager 110 may be configured to manage charge operations performed on the ESD 150. The ESD manager 110 may be configured to manage charge operations during respective usage periods 715 (e.g., manage charge operation during each usage period 715A-N). The ESD manager 110 may be configured to manage charge operations during respective usage periods 715A-N in accordance with charge configurations 121A-N determined for the respective usage periods 715A-N, as disclosed herein.

FIG. 12 illustrates a flow diagram of a fourth example of a method 1200 for managing ESD 150. At 1210, the ESD manager 110 may retrieve an aging model 125 for an ESD 150, the aging model 125 configured to predict performance loss to be incurred by the ESD 150 under respective charge conditions 124 of a plurality of charge conditions 124 (e.g., charge conditions 124A-N). The aging model 125 retrieved at 1210 may be configured to quantify a maximum extent of degradation ($M_{ch}$) to an ESD performance characteristic under respective charge conditions 124 (and/or charge configurations 121). The aging model 125 retrieved at 1210 may quantify a maximum extent of degradation ($M_{ch}$) to an energy storage capacity of the ESD 150 under the respective charge conditions 124. The aging model 125 may be further configured to predict the rate at which the ESD performance characteristic (e.g., energy storage capacity) will reach the maximum extent of degradation ($M_{ch}$) under the respective charge conditions 124. The aging model 125 may, therefore, predict degradation of ESD performance characteristics as a function of time (e.g., at respective times during a specified usage timeframe or timespan 615).

At 1220, the ESD manager 110 may utilize the aging model 125 to determine a charge configuration 121 for the ESD 150 that maintains an amount of performance loss incurred by the ESD 150 under a threshold for a specified timespan (e.g., a usage timespan or timespan 615). In some implementations, the ESD manager 110 is configured to segment to specified timespan into a plurality of usage periods 715 and determine a charge configuration 121 for each usage period 715, the charge configurations 121 determined such that a cumulative performance loss incurred by the ESD 150 over the plurality of usage periods 715 is maintained below the threshold.

At 1230, the ESD manager 110 may cause a charging device 130 to perform one or more charge operations on the ESD 150 in accordance with the determined charge configuration 121. The charge configuration 121 may define, inter alia, a charge rate for the one or more charge operations. Causing the charging device 130 to perform a charge operation on the ESD 150 may comprise generating charge instructions 131 corresponding to the determined charge configuration 121, the charge instructions 131 configured to cause the charging device to implement the charge operation in accordance with the determined charge configuration 121. The determined charge configuration 121 may define a multi-step charge operation and causing the charging device 130 to perform the charge operation may comprise generating a plurality of charge step commands 241, each charge step command 241 configured to cause the charging device 130 to implement a respective one of the plurality of charging steps of the multi-step charge operation.

FIG. 13 illustrates a flow diagram of a fifth example of a method 1300 for managing ESD 150. At 1310, the ESD manager 110 may be configured to construct an aging model 125 configured to predict degradation to a performance characteristic of an ESD 150 over a usage timespan 615 based, at least in part, on charge conditions 124 on the ESD 150 during the usage timespan 615. The aging model 125 may be configured to quantify a maximum extent of degradation to the performance characteristic incurred due to the charge conditions 124 (e.g., $M_{ch}$) and/or project a rate at which the performance characteristic of the ESD 150 will reach the maximum extent of degradation.

At 1320, the ESD manager 110 may be further configured to determine a charge configuration 121 for the ESD 150 to guarantee that the performance characteristic of the ESD 150 will remain above a threshold throughout the usage timespan 615 based, at least in part, on the aging model 125. The ESD manager 110 may determine a charge configuration 121 capable of satisfying a usage guarantee 613, as disclosed herein. In some implementations, the ESD manager 110 is configured to divide the usage timespan 615 into a plurality of usage periods 715 and determining a plurality of charge configuration 121, each charge configuration 121 specifying charge conditions 124 of the ESD 150 during a respective one of the charge periods 715. The ESD manager 110 may determine an amount of degradation to the performance characteristic at an end of the usage timespan 615 based, at least in part, on the charge conditions 124 of the ESD 150 during each usage period 715 of the plurality of usage periods 715.

At 1330, the ESD manager 110 may implement charge operations on the ESD 150 in accordance with the determined charge configuration 121. Implementing the charge operations on the ESD 150 may comprise generating charge instructions 131 configured to cause a charging device 130 to implement the charge operations on the ESD 150 in accordance with the determined charge configuration 121 and causing the charging device 130 to implement the charge instructions 131.

FIG. 14 illustrates a flow diagram of a method 1400 for developing an aging model 125 of an ESD 150 (and/or ESD type).

At 1410, the ESD manager 110 may be configured to acquire a plurality of charge-related aging (CRA) datasets 164 corresponding to the ESD 150 (or ESD type), each CRA dataset 164 comprising measurements of performance degradation observed in a first ESD 150 charged under charge conditions 124 of a first set of charge conditions 124 (e.g., charge conditions 124A-N). The charge conditions 124 of the first set of charge conditions 124 may be configured to produce charge-related performance degradation that exceed a model threshold.

At 1420, the ESD manager 110 may be configured to acquire one or more NCRA datasets 162, each NCRA dataset 162 comprising measurements of performance degradation observed in a second ESD 150 charged under charge conditions 124 of a second set of charge conditions 124. The charge conditions 124 of the second set of charge conditions 124 may be configured to produce charge-related performance degradation below the model threshold (e.g., charge conditions 124X).

At 1430, the aging model 125 for the ESD 150 (and/or ESD type) may be developed by, inter alia, comparing the CRA datasets 164 acquired at 1410 to the NCRA datasets 162 acquired at 1420. At 1430, a maximum extent of age-related performance degradation may be determined based, at least in part, on performance degradation observed in one or more of the CRA datasets 164 and NCRA datasets 162 and attributing a portion of the maximum extent of age-related performance degradation to respective charge conditions 124 of the first set of charge conditions 124 (e.g., charge conditions 124A-N) based, at least in part, on comparisons between the CRA datasets 164 and the NCRA datasets 162.

Alternatively, or in addition, developing the aging model 125 at 1430 may comprise performing a regression analysis on the CRA datasets 164 and/or NCRA datasets 162. As disclosed above, the NCRA datasets 162 are configured to quantify performance degradation due to non-charge-related mechanisms (e.g., under baseline charge conditions 124X configured to exclude or minimize performance degradation due to charge-related aging). By contrast, the CRA datasets 164 may be configured to model charge-related aging under non-baseline charge conditions 124A-N. The regression analysis at 1430 may comprise characterizing differences between performance degradation observed in the CRA datasets 164 and performance degradation observed in the NCRA datasets 162, which differences may be attributable to charge-related aging (e.g., $M_{ch}^{°}$, $p_{ch}$ and/or $q_{ch}$). The regression analysis may comprise distinguishing charge-related performance degradation from non-charge-related performance degradation (under respective sets of charge conditions 124A-N) based on differences in the extent and/or rate of performance degradation between the NCRA datasets 162 and CRA datasets 164. The regression analysis may comprise determining an MA quantity based on the maximum extent of charge-related performance degradation observed over time (e.g., based on differences between the extent of performance degradation observed in the NCRA datasets 162 and the extent of performance degradation observed in the CRA datasets 164). The regression analysis may further comprise determining the $p_{ch}$ and/or $q_{ch}$ terms of Eq. 17, which may be configured to model the rate at which charge-related performance degradation occurs over time (e.g., model the rate at which chemical reactions of the charge-related aging mechanism occur under specified charge conditions 124). The CRA datasets 164 may determine $p_{ch}$ and/or $q_{ch}$ quantities associated with respective charge conditions 124A-N based on differences between performance degradation observed under the respective charge conditions 124A-N. In some implementations, the determining comprises fitting $p_{ch}$ and/or $q_{ch}$ of Eq. 17 to charge-related performance degradation determined for respective charge conditions 124A-N.

Although the subject matter has been described in language specific to structural features and/or methodological operations, it is to be understood that the subject matter defined in the appended claims is not necessarily limited to the specific examples, features, or operations described herein, including orders in which they are performed.

What is claimed is:

1. A method, comprising:
retrieving an aging model for an energy storage device (ESD), the aging model configured to quantify charge-related performance loss predicted to be incurred by the ESD under respective charge conditions of a plurality of charge conditions and distinguish the charge-related performance loss from non-charge-related performance loss predicted to be incurred by the ESD due to non-charge-related conditions;

utilizing the aging model to determine a charge configuration for the ESD that maintains performance loss predicted to be incurred by the ESD under a threshold for a specified timespan; and causing a charging device to perform one or more charge operations on the ESD in accordance with the determined charge configuration.

2. The method of claim 1, wherein the ESD comprises a battery and wherein the charge configuration determined for the ESD specifies a charge rate for the one or more charge operations.

3. The method of claim 1, wherein causing the charging device to perform a charge operation on the ESD comprises:

generating charge instructions corresponding to the determined charge configuration, the charge instructions configured to cause the charging device to implement the charge operation in accordance with the determined charge configuration.

4. The method of claim 1, wherein the determined charge configuration defines a multi-step charge operation, and wherein determining the charge configuration for the ESD further comprises:

determining a plurality of charge step configurations, each charge step configuration configured to cause the charging device to implement a respective one of a plurality of charging steps of the multi-step charge operation, each charging step configured to raise a state of charge (SOC) of the ESD from a respective start SOC to a respective target SOC;

wherein the aging model is configured to quantify the charge-related performance loss predicted to be incurred by the ESD based, at least in part, on charge conditions corresponding to respective charge step configurations of the plurality of charge step configurations.

5. The method of claim 1, wherein the aging model is further configured to quantify a maximum extent of degradation to an energy storage capacity of the ESD under the respective charge conditions.

6. The method of claim 5, wherein the aging model is further configured to predict a rate at which the energy storage capacity of the ESD will reach the maximum extent of degradation under the respective charge conditions.

7. The method of claim 1, wherein the aging model is configured to quantify degradation of a performance characteristic of the ESD as a function of time and the respective charge conditions.

8. The method of claim 7, further comprising:

segmenting the specified timespan into a plurality of usage periods; and determining a plurality of charge configurations for the usage periods, the plurality of charge configurations determined such that a cumulative performance loss predicted to be incurred by the ESD over the plurality of usage periods is maintained below the threshold.

9. The method of claim 1, further comprising developing the aging model for the ESD, comprising:

acquiring a plurality of charge-related aging (CRA) datasets corresponding to the ESD, each CRA dataset comprising measurements of performance degradation observed in a first ESD charged under charge conditions of a first set of charge conditions, the charge conditions of the first set of charge conditions configured to produce charge-related performance degradation exceeding a model threshold;

acquiring one or more non-charge-related aging (NCRA) datasets corresponding to the ESD, each NCRA dataset comprising measurements of performance degradation observed in a second ESD charged under charge conditions of a second set of charge conditions, the charge conditions of the second set of charge conditions configured to produce charge-related performance degradation below the model threshold; and comparing the CRA datasets to the NCRA datasets.

10. The method of claim 9, wherein developing the aging model for the ESD further comprises:

determining a maximum extent of age-related performance degradation based, at least in part, on performance degradation observed in one or more of the CRA datasets and the NCRA datasets; and attributing a portion of the maximum extent of age-related performance degradation to respective charge conditions of the first set of charge conditions based, at least in part, on comparisons between CRA datasets corresponding to the respective charge conditions of the first set of charge conditions and the NCRA datasets.

11. The method of claim 1, wherein:

the aging model is further configured to quantify performance loss predicted to be incurred by the ESD under baseline conditions, and utilizing the aging model to determine the charge configuration for the ESD comprises modifying charge conditions of the baseline conditions and predicting performance loss to be incurred by the ESD under the modified charge conditions.

12. An apparatus, comprising:

a processor coupled to a memory; and an energy storage device (ESD) manager configured for operation on the processor, the ESD manager configured to:

retrieve an aging model for an ESD, the aging model configured to predict a quantity of performance loss to be incurred by the ESD under respective charge conditions of a plurality of charge conditions, and distinguish the quantity of performance loss predicted for the respective charge conditions from a quantity of performance loss predicted to be incurred by the ESD due to non-charge-related conditions, utilize the aging model to determine a charge configuration for the ESD that maintains performance loss predicted to be incurred by the ESD under a threshold for a specified timespan, and cause a charging device to implement a charge operation on the ESD in accordance with the determined charge configuration.

13. The apparatus of claim 12, wherein the ESD manager is further configured to:

retrieve a plurality of charge-related aging (CRA) datasets corresponding to the ESD, each CRA dataset comprising measurements of performance degradation observed in a first ESD charged under charge conditions of a first set of charge conditions, the charge conditions of the first set of charge conditions configured to produce charge-related performance degradation exceeding a model threshold;

acquire one or more non-charge-related aging (NCRA) datasets corresponding to the ESD, each NCRA dataset comprising measurements of performance degradation observed in a second ESD charged under charge conditions of a second set of charge conditions, the charge conditions of the second set of charge conditions configured to produce charge-related performance degradation below the model threshold; and determine the aging model for the ESD based, at least in part, on comparisons between the CRA datasets and the NCRA datasets.

14. The apparatus of claim 13, wherein the ESD manager is further configured to:
    determine a maximum extent of age-related performance degradation based, at least in part, on performance degradation observed in one or more of the CRA datasets and the NCRA datasets; and
    attribute a portion of the maximum extent of age-related performance degradation to respective charge conditions of the first set of charge conditions based, at least in part, on comparisons between CRA datasets corresponding to the respective charge conditions of the first set of charge conditions and the NCRA datasets.

15. The apparatus of claim 12, wherein the ESD manager is further configured to:
    divide the specified timespan into a plurality of usage periods;
    determine a plurality of charge configurations for the ESD, each specifying charge conditions for the ESD during a respective usage period of the plurality of usage periods, the plurality of charge configurations determined such that the aging model predicts that performance loss incurred by the ESD will remain under the threshold throughout the plurality of usage periods; and
    generate charge instructions configured to cause the charging device to implement charge operations on the ESD during respective usage periods of the plurality of usage periods in accordance with corresponding charge configurations of the plurality of charge configurations determined for the ESD.

16. The apparatus of claim 12, wherein the aging model is further configured to predict a quantity of performance loss to be incurred by the ESD under baseline conditions, and wherein, to determine the charge configuration for the ESD, the ESD manager is further configured to modify charge conditions of the baseline conditions and predict performance loss to be incurred by the ESD under the modified charge conditions.

17. A non-transitory computer-readable storage medium comprising instructions configured to cause a processor to implement operations for managing energy storage, the operations comprising:
    acquiring an aging model configured to predict degradation to a performance characteristic of an energy storage device (ESD) over a usage timespan, the aging model further configured to quantify charge-related degradation to the performance characteristic predicted due to charge conditions on the ESD during the usage timespan and to distinguish the charge-related degradation from non-charge-related degradation to the performance characteristic predicted due to non-charge-related conditions on the ESD during the usage timespan;
    determining a charge configuration for the ESD, the charge configuration determined such that the aging model predicts that the performance characteristic of the ESD will remain above the threshold throughout the usage timespan; and
    generating charge instructions configured to cause a charging device to implement charge operations on the ESD in accordance with the determined charge configuration.

18. The non-transitory computer-readable storage medium of claim 17, wherein the operations further comprise developing the aging model for the ESD, the developing comprising:
    acquiring a plurality of charge-related aging (CRA) datasets corresponding to the ESD, each CRA dataset comprising measurements of performance degradation observed in a first ESD charged under charge conditions of a first set of charge conditions, the charge conditions of the first set of charge conditions configured to produce charge-related performance degradation exceeding a model threshold;
    acquiring one or more non-charge-related aging (NCRA) datasets corresponding to the ESD, each NCRA dataset comprising measurements of performance degradation observed in a second ESD charged under charge conditions of a second set of charge conditions, the charge conditions of the second set of charge conditions configured to produce charge-related performance degradation below the model threshold; and
    comparing the CRA datasets to the NCRA datasets.

19. The non-transitory computer-readable storage medium of claim 18, wherein developing the aging model for the ESD further comprises:
    determining a maximum extent of age-related performance degradation based, at least in part, on performance degradation observed in one or more of the CRA datasets and the NCRA datasets; and
    attributing a portion of the maximum extent of age-related performance degradation to respective charge conditions of the first set of charge conditions based, at least in part, on comparisons between CRA datasets corresponding to the respective charge conditions of the first set of charge conditions and the NCRA datasets.

20. The non-transitory computer-readable storage medium of claim 17, wherein the aging model is configured to:
    quantify a maximum extent of degradation to the performance characteristic incurred due to the charge conditions, and
    project a rate that the performance characteristic of the ESD will reach the maximum extent of degradation.

21. The non-transitory computer-readable storage medium of claim 17, the operations further comprising:
    dividing the usage timespan into a plurality of usage periods;
    determining a plurality of charge configurations for the ESD, each specifying charge conditions for the ESD during a respective usage period of the plurality of usage periods, the plurality of charge configurations determined such that the aging model predicts that the performance characteristic of the ESD will remain above the threshold throughout the plurality of usage periods; and
    generating the charge instructions such that the charge instructions are configured to cause the charging device to implement charge operations on the ESD during respective usage periods of the plurality of usage periods in accordance with corresponding charge configurations of the plurality of charge configurations determined for the ESD.

22. The non-transitory computer-readable storage medium of claim 21, further comprising determining an amount of degradation to the performance characteristic at an end of the usage timespan based, at least in part, on the charge conditions of the ESD during each usage period of the plurality of usage periods.

23. The non-transitory computer-readable storage medium of claim 17, wherein:
   the aging model is further configured to predict degradation to the performance characteristic of the ESD over the usage timespan due to baseline conditions, and
   determining the charge configuration for the ESD comprises modifying charge conditions of the baseline conditions and predicting performance degradation to the performance characteristic of the ESD due to the modified charge conditions.

* * * * *